United States Patent [19]

Evans

[11] Patent Number: 4,733,222
[45] Date of Patent: Mar. 22, 1988

[54] CAPACITANCE-VARIATION-SENSITIVE TOUCH SENSING ARRAY SYSTEM

[75] Inventor: John W. Evans, La Jolla, Calif.

[73] Assignee: Integrated Touch Arrays, Inc., La Jolla, Calif.

[21] Appl. No.: 853,428

[22] Filed: Apr. 18, 1986

Related U.S. Application Data

[63] Continuation-in-part of Ser. No. 566,045, Dec. 27, 1983, abandoned.

[51] Int. Cl.$^4$ .............................................. G06F 3/02
[52] U.S. Cl. ............................ 340/365 C; 340/365 R; 200/DIG. 1
[58] Field of Search ............ 340/365 C, 365 R, 365 S, 340/712, 365 VL; 178/18; 200/DIG. 1; 400/485, 477

[56] References Cited

U.S. PATENT DOCUMENTS

| | | | |
|---|---|---|---|
| 3,921,166 | 11/1975 | Volpe | 340/365 C |
| 4,305,135 | 12/1981 | Dahl et al. | 340/365 S |
| 4,359,720 | 11/1982 | Chai et al. | 340/365 C |

OTHER PUBLICATIONS

Irwin–IBM Technical Disclosure Bulletin, Jan. 1983, vol. 25, No. 8, p. 4097.

Primary Examiner—Gerald L. Brigance
Assistant Examiner—Mahmoud Fatahi-yar
Attorney, Agent, or Firm—Edward W. Callan

[57] ABSTRACT

A capacitance-variation-sensitive touch sensing array system includes an array of electrodes where each electrode is a connected series of conductive tabs and forms either a row or a column of the electrode array; an array of drive lines where each drive line is capacitively coupled to a plurality of the electrodes; a drive signal generator for applying alternating signal packets to the drive lines; an array of sense lines where each sense line is capacitively coupled to a plurality of the electrodes so that signals are derived from the electrodes when drive signals are applied to the drive lines. The number of electrodes is equal to the product of the number of drive lines and the number of sense lines. Based on values derived from signals on the sense lines, a microprocessor provides information associated with touch by an operator. The array of electrodes may be configured so as to result in a touch-actuated keyboard where the number of keys is equal to the product of the number of row electrodes and the number of column electrodes; or the array of electrodes may be configured so that finger touch position in a single large touch responsive area can be sensed and processed for use in control applications.

45 Claims, 22 Drawing Figures

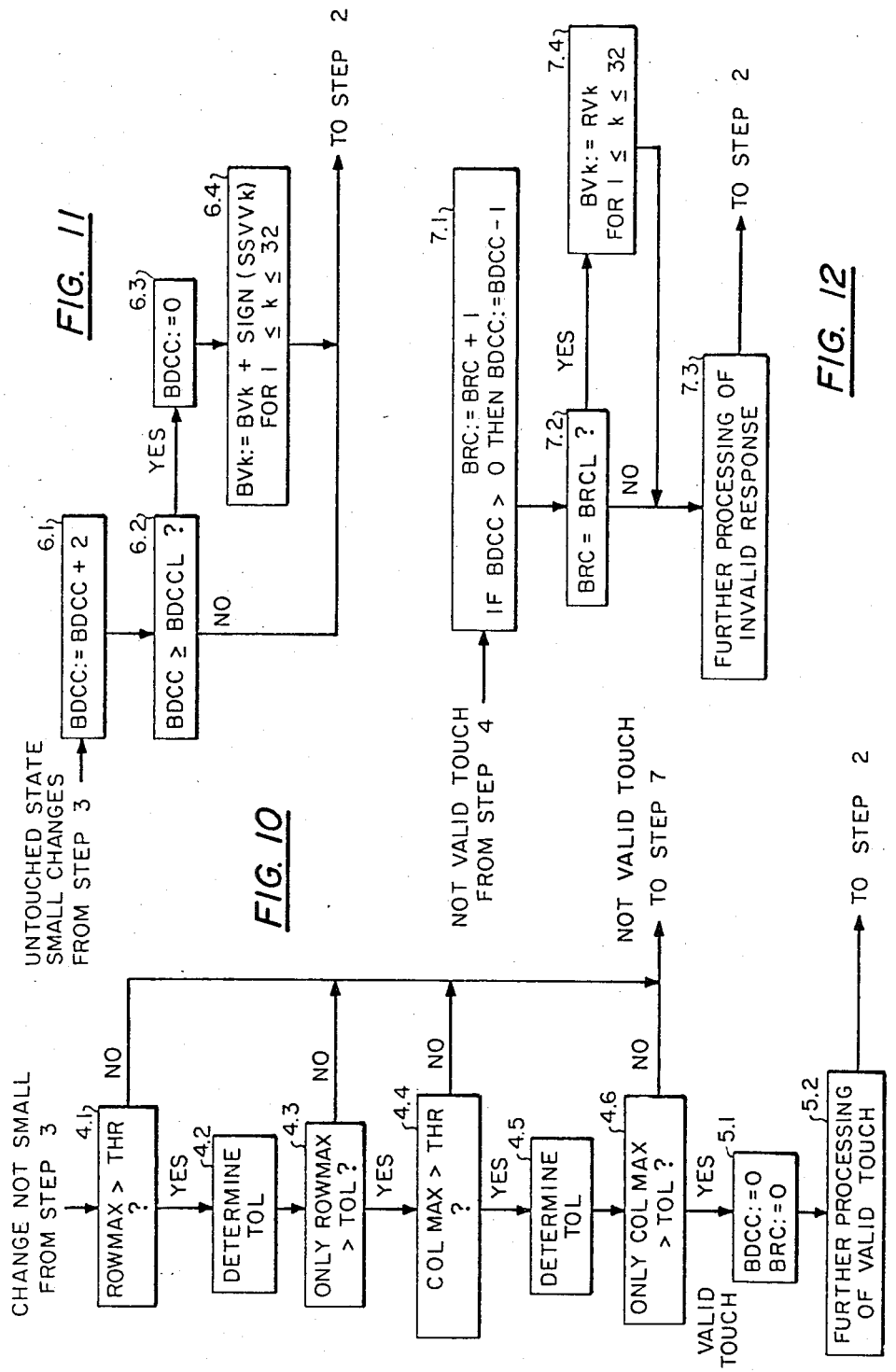

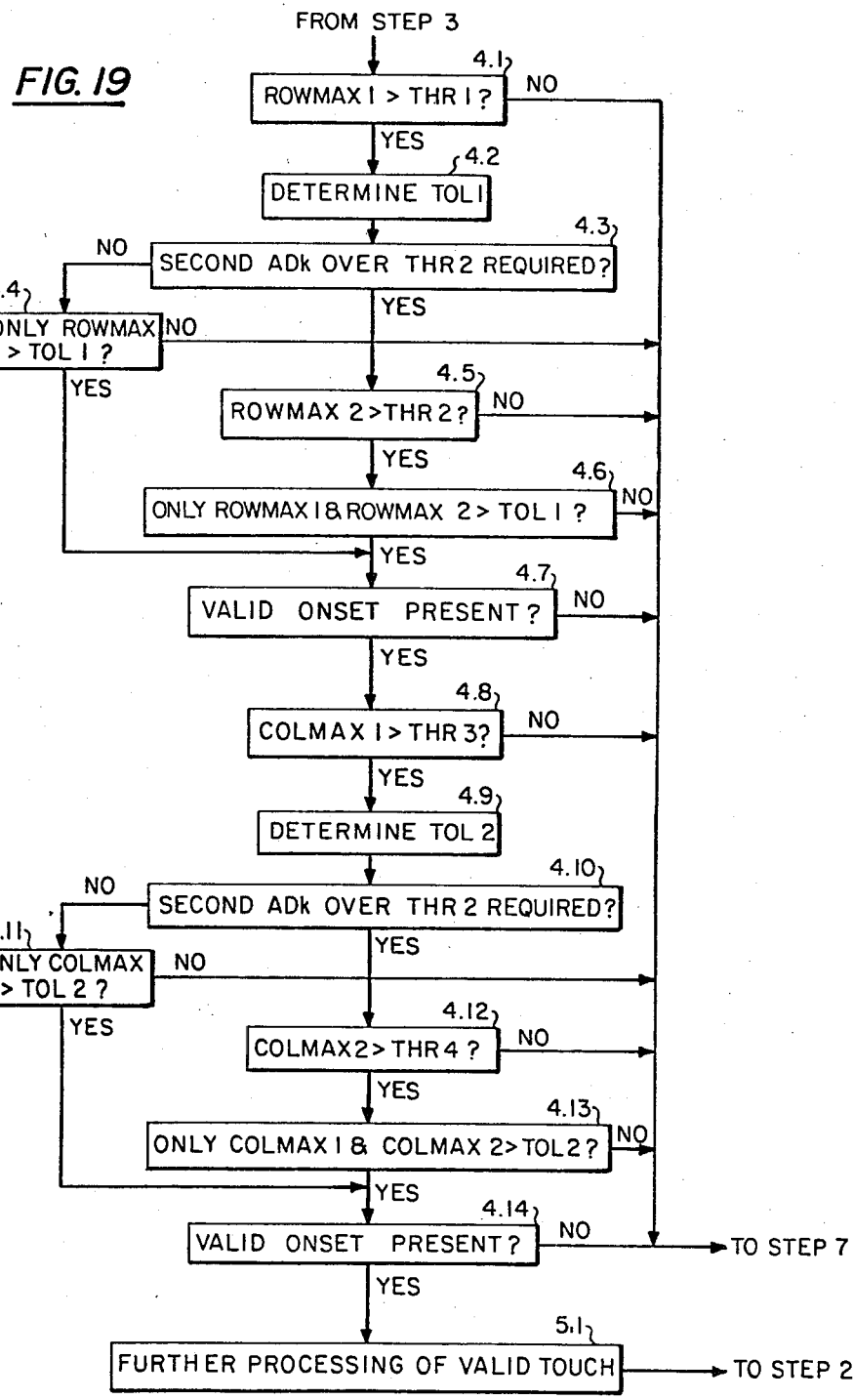

CAPACITANCE-VARIATION-SENSITIVE TOUCH SENSING ARRAY SYSTEM

RELATION TO PRIOR APPLICATION

This is a continuation-in-part of co-pending application Ser. No. 566,045 filed on Dec. 27, 1983, now abandoned.

BACKGROUND OF THE INVENTION

The present invention pertains to improvements in capacitance-variation-sensitive touch sensing array systems.

A touch sensing array system may include an array of individual touch responsive areas which may be operated as keys on a keyboard or may include a single relatively large touch responsive area which may be operated for control purposes as a touch pad to provide an indication associated with a given position in the array. In a capacitance-variation-sensitive touch sensing array system, the touching of a touch responsive area results in a variation of the capacitance between one or more electrodes and circuit ground. This variation results in the variation of a sense signal produced on one or more sense lines coupled to the respective electrodes. In a typical capacitance-variation-sensitive touch sensing array system, each electrode is driven by an alternating current or pulse signal. Sense signals are produced on the respective sense lines coupled to the respective driven electrodes. The sense signals are processed to determine whether a touch responsive area has been touched by an operator.

A typical touch sensing array has three types of conductors: drive lines, sense lines, and electrodes.

A drive line is a conductor coupled to a drive signal generator and capacitively coupled to one or more electrodes. Typically an enlarged portion of the drive line constitutes a plate of a drive line-to-electrode capacitor.

A sense line is a conductor coupled to a sense signal detector and capacitively coupled to one or more electrodes. Typically an enlarged portion of the sense line constitutes a plate of an electrode-to-sense line capacitor.

An electrode is a conductor capacitively coupled to at least one drive line and capacitively coupled to at least one sense line. Typically an electrode has one or more enlarged portions or plates, hereafter called tabs, which furnish a capacitor plate to complete a capacitive coupling between the electrode and the body of an operator, and thereby to system ground, when the tab or the area overlying the tab is touched by a finger of the operator. The electrode part of a drive line-to-electrode capacitor or electrode-to-sense line capacitor may be one or more tabs of the electrode, or may be a conductive plate of the electrode not serving as a tab.

U.S. Pat. No. 4,145,748 to Eichelberger and Butler is relevant to the present invention. This patent describes a touch sensing array involving drive lines, sense lines, and electrodes. In this system, there is a unique electrode at the intersection of each drive line and sense line, and each electrode is associated with only one key. The number of keys is equal to the product of the number of drive lines and the number of sense lines. Under the direction of control logic means, voltage pulses are applied sequentially to the individual drive lines and the resulting signals on the sense lines are individually processed by an A/D converter to produce a digital output count uniquely associated with a pair made up of a single drive line and a single sense line and therefore with the unique electrode which lies at the intersection of said single drive line and said single sense line. The digital output associated with each electrode is compared to a "no-touch" digital count unique to that electrode which is stored in a memory and updated periodically by a count of at most one. Each comparison of a digital count associated with a specific electrode to the "no-touch" digital count associated with that electrode, results in an independent determination of the presence or absence of touch of that electrode. In the event of an extended dwell time of operator touch, the "no-touch" digital count becomes incorrect as an indicator of the absence of touch for the key(s) touched. This is because the periodic updates occur regularly, even during the dwell period. This condition may result in "false negatives" wherein the touch array is not responsive to operator touch of affected keys. The condition is corrected after a sufficient number of periodic updates in the absence of operator touch.

Other relevant teachings in the prior art are described below.

Several touch sensing array systems are described in U.S. Pat. No. 4,233,522 to Grummer and Hendriks. Each of these systems involves one drive line, a plurality of sense lines and a plurality of electrodes. The sense lines are divided into row sense lines and column sense lines and there are a number of keys equal to the product of the number of row sense lines and the number of column sense lines. Each sense line is connected to a unique detection circuit. A common feature of these systems is an array of touch actuated keys. Each key is composed in part of two tabs; each tab is a directly touchable conductive plate. The tabs are arranged on the top side of a substrate in a coordinate grid of rows and columns where each row of tabs is associated with a unique row sense line and each column of tabs is associated with a unique column sense line. Each key has one row tab and one column tab. Actuation of a selected key is brought about by concurrent direct touching of the two tabs of the key. In a first and second embodiment, the tabs of each row and the tabs of each column are electrically connected to form electrodes. This requires crossing over of selected conductor runs connecting the tabs. In the first embodiment, on the bottom surface of the substrate, there is a single drive line which delivers a common drive signal to each of the electrodes; the coupling of the drive line to the electrode is capacitive and is effected by a plurality of expanded conductive plates linked to the drive line and underlying a portion of each of the tabs of each electrode; also on the bottom surface of the substrate are a plurality of sense lines; there is a unique sense line for each row electrode and for each column electrode; each sense line is capacitively coupled to a particular row or column electrode by expanded conductive plates linked to the sense line and underlying the tabs of the electrode. Crossing over of selected conductor runs is required on the bottom surface of the substrate. In the second embodiment, there are no conductors on the bottom side of the substrate and the capacitive couplings of the drive line and of the sense lines to row and column electrodes are carried out using discrete components in an electrical circuit located separate from the touch panel. A third embodiment resembles the second embodiment except that there are two layers of conductive traces on the top side of the supporting substrate and crossing over of conductive runs is not required; these two layers of conductive traces are separated by a thin dielectric film; the tabs of the columns lie on the top side of this dielectric film and are connected by conductive traces as in embodiments one and two; the tabs of each row are also on the top side of the dielectric film but are not linked to form a single conductor; each tab in a row overlies an expanded portion of a single conductor on the bottom side of the dielectric film and thereby is strongly capacitively coupled to this single conductor which is coupled to the common drive line and to a unique sense line as in embodiment two. In all three of the embodiments, the detection circuits connected to the sense lines are scanned in a sequential manner to detect touch. Because of the direct touch of the touchable plates, a capacitive coupling to ground on the order of 100 pf is brought about by operator touch. Changes of this large magnitude can be detected by very simple means. Apart from the scanning process, each detection circuit operates independently to report a state of touch or no touch for a particular row or column. The logic of key touch reporting is based on the outputs of the independent detection circuits.

In U.S. Pat. No. 4,290,052 to Eichelberger et al., a physical layout of a touch sensing array is given. Touch sensing circuitry is fabricated on a double sided printed circuit board adhesively bonded to the bottom surface of an insulative substrate such as glass. Squarish touch electrodes are formed on the top side of the printed circuit board and transmitter (drive line) and receiver (sense line) electrode tabs in registration therewith are formed on the bottom side of the printed circuit board. Electrical components and interconnection leads are fabricated as an integral part of the conductor patterns on the surfaces of the printed circuit board. The number of keys is equal to the product of the number of drive lines and the number of sense lines.

In another type of touch sensing array system, the drive lines and sense lines are combined to form a plurality of drive/sense lines. A touch sensing array of this type is described in U.S. Pat. No. 3,757,322 to Harold Barkan et al. In this device, there is a coordinate grid made up of row and column electrodes wherein each electrode is coupled to a unique drive/sense line; there is a key at the intersection of each row and column electrode; and the number of keys is equal to the product of the number of row electrodes and the number of column electrodes. The operator concurrently and directly touches a tab of a row electrode and a tab of a column electrode to activate a key. A further touch sensing array having combined drive/sense lines is described in U.S. Pat. No. 4,288,786 to Ferenc Ledniczki. In this device, there are n pairs of drive/sense lines and 2 to the nth power electrodes; each electrode is capacitively coupled to one line in each pair of drive/sense lines; and each electrode is associated with a unique key.

Other types of keyboards share with touch sensing array systems the features of drive lines, sense lines, and sense signal processing. In particular, numerous capacitance actuated keyboards based on changes in capacitance brought about by mechanical displacement exist in the prior art and are in widespread use. Such keyboards are disclosed, for example, in U.S. Pat. Nos. 3,921,166 to Volpe, 4,305,135 to Dahl et al., and 4,359,720 to Chai et al.

Prior art capacitance-variation-sensitive touch sensing array systems are further described in U.S. Pat. Nos. 4,290,052 to Eichelberger et al; 4,379,287 to Tyler et al; 4,305,135 to Dahl et al; 4,157,539 to Hunts et al; 3,691,555 to Looschen; 4,321,479 to Ledniczki et al; 4,103,252 to Bobick; and 3,921,167 to Fox, and in Publication No. T904,008 by Crouse. Capacitance-variation tabs also are described in U.S. Pat. No. 3,492,440 to Cerbone et al and in IBM Technical Disclosure Bulletin, Vol. 17, No. 1, June 1974, page 166–7, "Touch-Sensing Circuit", by J. A. Williams.

SUMMARY OF THE INVENTION

The present invention provides an improved capacitance-variation-sensitive touch sensing array system involving no moving parts for which the array may be inexpensively fabricated in a monolithic construction that is easy to maintain. The nature of the basic combination of elements in the system provides the following advantages:

(i) Only a small number of connections are needed between passive circuitry capacitively coupled to an array of electrodes and active circuitry used to detect touch.

(ii) The array of electrodes may be configured so as to result in a touch-actuated keyboard with each of a plurality of touch responsive areas serving as an individual key; or the array of electrodes may be configured so that finger touch position in a single touch responsive area of a touch pad can be sensed and processed for use in control applications.

(iii) Relatively few and simple parts are used to construct a large array of many more keys then ordinarily are associated with conventional keyboards.

(iv) The touch responsive areas may be legendized by overlays, which may be sheets of computer printout.

(v) Even with considerable stray capacitive coupling in the sytem, sense signals produced in a complete scan of the system may be processed as one or more groups to accurately recognize whether variations in the sense signals are the result of a valid touch.

(vi) Sense signals produced in the system may be processed in such a manner as to allow portions of the touch sensing array not in use to be covered with nonconducting materials such as papers or books.

The capacitance-variation-sensitive touch sensing array system of the present invention includes an array of electrodes with each electrode including one or a connected series of conductive tabs; an array of drive lines capacitively coupled to the electrodes; a drive signal generator for applying drive signals to the drive lines to drive the electrodes coupled thereto; an array of sense lines capacitively coupled to the electrodes to derive sense signals from the electrodes when drive signals are applied to the drive lines; and means coupled to the sense lines for sensing the sense signals on the respective sense lines, with the amplitudes of the respective sense signals being dependent upon whether the capacitance between a driven electrode coupled to the sense line and circuit ground is varied by an operator touching an area overlying a tab of a driven electrode; and a signal processing system coupled to the sensing means for processing the sense signals to provide information associated with touch by an operator. The electrodes are disposed in relation to the drive lines and the sense lines to provide a system in which the number of electrodes exceeds the sum of the number of drive lines and the number of sense lines and in which the number of keys is greater than the number of electrodes. Preferably the sense signals are converted by analog-to-digital conversion to sense signal values for processing by the signal processing system.

Preferably, each electrode is capacitively coupled to only one drive line and to only one sense line; each of the drive lines is capacitively coupled to a plurality of electrodes; and each of the sense lines is capacitively coupled to a plurality of electrodes. No given drive line and sense line pair is connected to more than one electrode in common, and the number of electrodes is equal to the product of the number of drive lines and the number of sense lines. Thus the number of electrodes can exceed the sum of the number of drive lines and the number of sense lines.

The drive signal generator under the control of a microprocessor associated control logic is adapted for repetitively applying a sequence of drive signals having different predetermined characteristics to the different drive lines to cause differently characterized sense signals to be derived on a sense line coupled to a plurality of different electrodes.

The drive signal on each drive line is a periodic occurence of an alternating signal packet that occurs either at a time when all other drive lines have no signal packets or preferably at a time when one other drive line has a synchronously occuring alternating signal packet of opposing polarity.

Preferably, at any one time, signals on the drive lines consist of alternating signal packets simultaneously applied to a single pair of drive lines, with the paired signal packets being synchronous with each other, of approximately the same value, and of opposing polarities to thereby cause the amplitude of the sense signals derived in response to said synchronous pair of drive signal packets to be low in relation to the variation in the amplitude of the sense signals resulting from touch by an operator. This novel opposing polarity feature enables the number of sense signals and related sense signal processing to be reduced by fifty percent.

Preferably, balancing of the oppositely polarized paired signal packets is achieved by selective trimming of the drive line-to-electrode capacitors and/or the electrode-to-sense line capacitors or alternatively by the signal processing system controlling the amplitude of one or both of the paired drive signals. The object of this balancing is to make the amplitude of each of the sense signals small in the absence of operator touch.

The touch sensing array is amenable to an inexpensive monolithic construction, wherein a first portion of the electrode array is supported by one side of a thin dielectric substrate and a second portion of the electrode array is supported by the opposite side of the thin dielectric substrate. In alternative embodiments, the drive lines and sense lines are supported by opposite sides of a second thin dielectric substrate that is separated by a third thin dielectric substrate from the first-mentioned dielectric substrate supporting the electrodes; or the drive lines and sense lines are supported on the same thin dielectric substrate as the electrodes. In the latter embodiment, a drive line or sense line on one side of the substrate is coupled to a plurality of electrodes on the opposite side of the substrate by a capacitor including a first plate supported by the one side of the substrate and extending from the coupled drive line or sense line; and a second oppositely disposed plate supported by the opposite side of the substrate and extending from each coupled electrode.

The touch sensing array system of the present invention can be configured for use as a keyboard. In a preferred embodiment the electrodes are arrayed in rows and columns and each key of the keyboard overlies a tab complex comprised of an enlarged portion, a tab, of one row electrode and a tab of one column electrode; and the number of keys is equal to the product of the number of row electrodes and the number of column electrodes. Thus the number of keys can greatly exceed the number of electrodes. The sense signals derived from the row and column electrodes are processed to provide information associated with whichever key is touched by an operator.

The touch sensing array system of the present invention also can be configured so that finger touch position can be sensed. In such embodiments the electrode array is dimensioned and disposed so that an operator firmly touching his finger to the interior area of a single touch responsive panel overlying and coextensive with the electrode array necessarily varies the capacitance to ground of a plurality of electrodes; and the signal processing system processes the sense signals to provide information associated with the position of touch. The processing system processes the relative magnitudes of variations in the sense signals and performs an interpolation routine using three relative magnitudes to provide an estimate of touch position.

In another aspect of the present invention that is applicable in general to capacitance-variation-sensitive touch sensing array systems and not merely to the system of the present invention having arrays of drive lines and sense lines capacitively coupled to arrays of electrodes, sense values in digital form are provided and the processing system processes complete sets of digital sense values iteratively as a group to ascertain the values of variations in the digital sense values and processes the variation values to determine whether said variations resulted from a touch responsive area being touched by an operator. In the processing, operator touch at a specific location is judged to be present when the variation values match a pattern of variation values characteristically associated with touch at that specific location. Such pattern matching constitutes a more powerful and versatile signal processing routine than is found in the prior art and allows the recognition of a valid touch response in capacitance-variation-sensitive touch sensing array systems in which, because of stray capacitive coupling, a significant change may occur in sense signal values not directly associated with electrodes underlying the position of operator touch.

Preferably the sense signal values are processed independently in one or more groups. Preferably for each group this processing proceeds in two stages. In a first, feature extraction stage a search is made for features of the group of variations of sense signal values indicative of touch. A second, confirmation stage is carried out when an affirmative determination is made in the first stage. In the confirmation stage, tests are carried out which confirm that a pattern of variation characteristic of touch by an operator is or is not present. In some embodiments, further stages of processing may be needed to more completely characterize the response of the touch sensing array system.

In a further aspect of the present invention that likewise is applicable to capacitance-variation-sensitive touch sensing array systems in general, sense signal values in digital form are provided in accordance with the amplitudes of the respective sense signals and the processing system processes the sense signals iteratively to determine whether a touch responsive area has been touched by an operator by comparing the sense signal values with baseline values derived from sense signal values provided when no touch responsive area is touched by an operator; and revises the baseline values in response to sensed variations in the sense signal values which are stable over a predetermined number of complete scans of the touch sensing array occurring in the absence of valid touch by an operator. This feature allows portions of the touch sensing array not in use to be covered with nonconducting materials, such as books or papers, without rendering the array inoperative.

Additional features of the present invention are described in relation to the description of the preferred embodiments.

BRIEF DESCRIPTION OF THE DRAWINGS

FIGS. 7 through 12 are flow charts of the program used by the microprocessor to process sense signal values in one preferred embodiment of the system of FIG. 1.

FIGS. 18 and 19 are flow charts of microprocessor programming applicable to the further preferred embodiment of FIG. 17 that is used in lieu of the programming illustrated in FIGS. 8-12.

DESCRIPTION OF THE PREFERRED EMBODIMENTS

Figure 1:
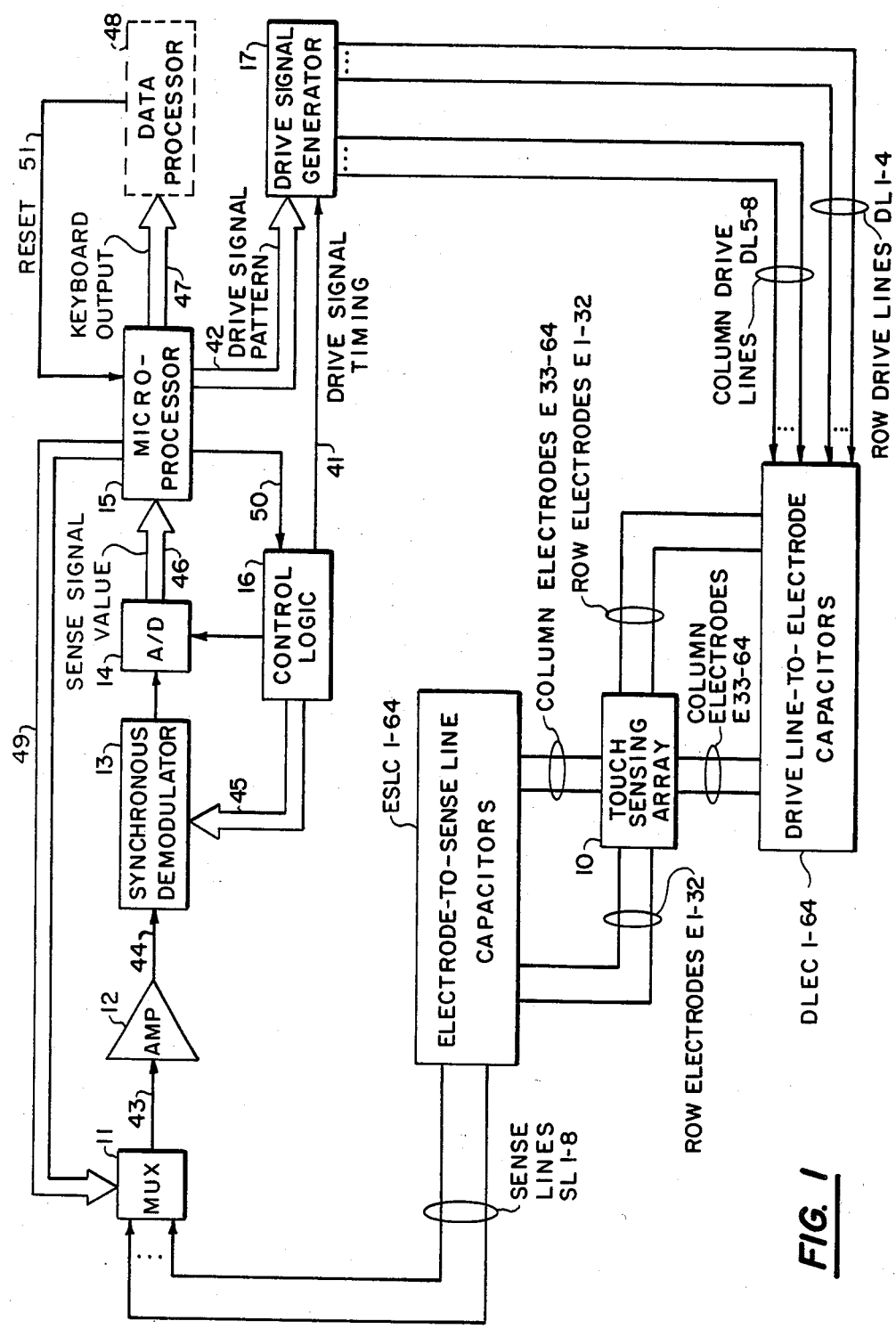
FIG. 1 is a block diagram of the system of the present invention.

Referring the FIG. 1, a preferred embodiment of the capacitance-variation-sensitive touch sensing array system of the present invention includes a 1024-key touch sensing array 10, constructed from thirty-two row electrodes E1-32 and thirty-two column electrodes E33-64, a drive line array that includes four row drive lines DL1-4 and four column drive lines DL5-8, an array of eight sense lines SL1-8, an array of sixty-four drive line-to-electrode capacitors DLEC1-64, an array of sixty-four electrode-to-sense line capacitors ESLC1-64, a multiplexer 11, an amplifier circuit 12, a synchronous demodulator 13, an analog-to-digital (A/D) converter 14, a microprocessor 15, a control logic circuit 16 and a drive signal generator 17.

While only thirty-two row electrodes and thirty-two column electrodes are included in this embodiment, it is to be understood that with a number "n" of drive lines DL and a number "m" of sense lines SL there may be $n \times m$ electrodes; and if a number "k" of the electrodes are row electrodes, then there would be $(n \times m) = k$ column electrodes and $k[(n \times m) - k]$ keys. In particular, with a number n of drive lines and the same number of sense lines, there may be n squared electrodes; and with half, or (n squared)/2, of the electrodes being row electrodes and with half being column electrodes, there may be (n to the fourth power)/4 keys. Thus with only 2n connections between active circuitry and the drive and sense lines in combination, a system of (n to the fourth power)/4 keys may be obtained.

Figure 2:
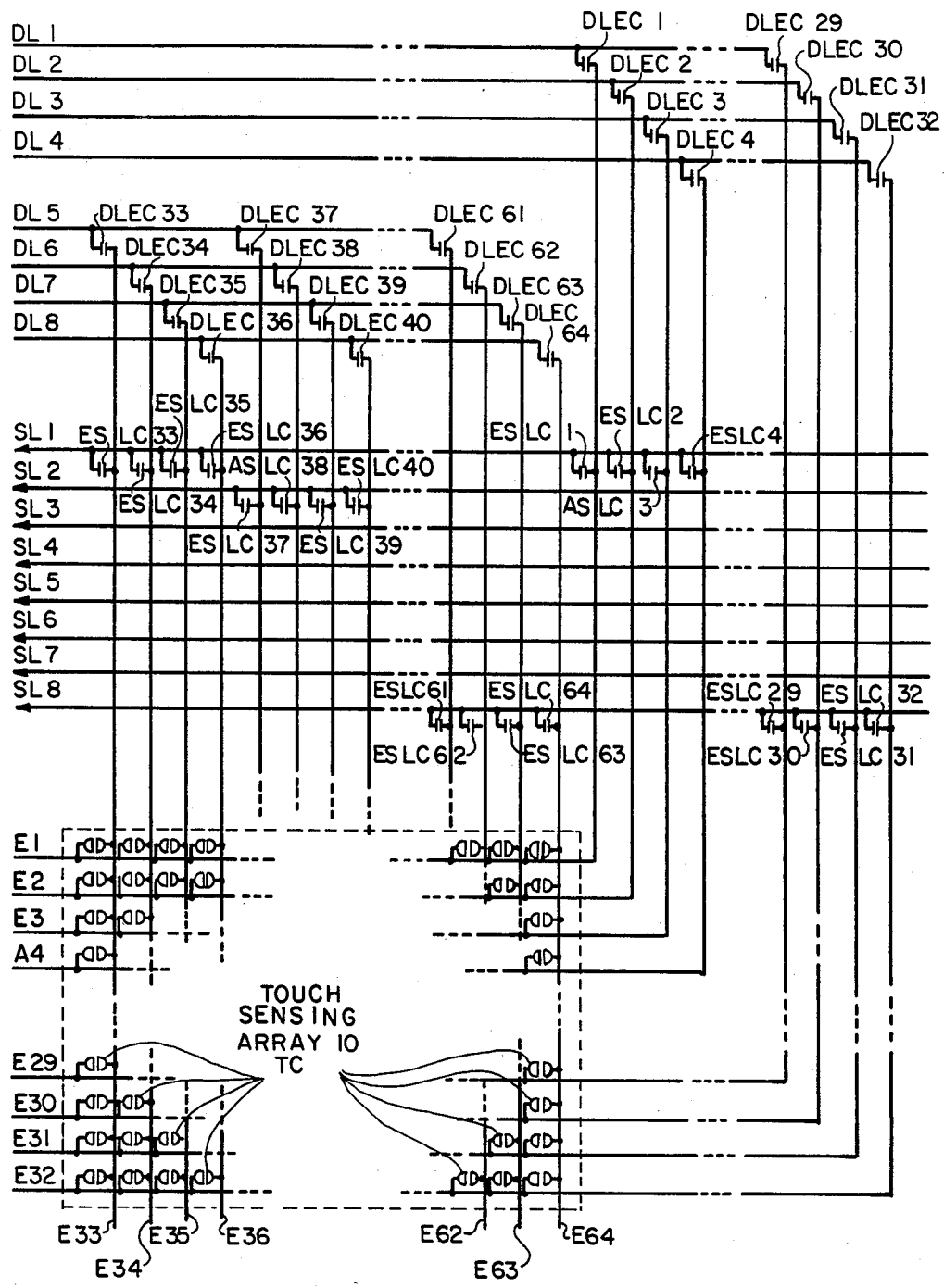
FIG. 2 is a partial schematic circuit diagram showing the capacitive interconnection between the drive lines, electrodes, and sense lines and showing the tabs of the electrodes in one preferred embodiment of the system of FIG. 1.

Referring to FIG. 2, illustrated schematically are tab complexes TC, each comprised of a tab of one of the row electrodes E1-32 and a tab of one of the column electrodes E33-64. Each of the electrodes E1-64 contributes a tab to thirty-two tab complexes TC. The drive lines D1-8 are capacitively coupled to the electrodes E1-64 by the drive line-to-electrode capacitors DLEC-1-64. The electrodes E1-64 are capacitively coupled to the sense lines SL1-8 by the electrode-to-sense line capacitors ESLC1-64. Each electrode E1-64 is capacitively coupled to only one drive line DL and to only one sense line SL. Each of the eight drive lines DL1-8 is capacitively coupled to eight of the sixty-four electrodes E1-64; and each of the eight sense lines SL1-8 is coupled to eight of the sixty-four electrodes E1-64. In effect each electrode E1-64 completes a T-bridge connection between a pair made up of a unique one of drive lines DL1-8 and a unique one of sense lines SL1-8.

Figure 3:
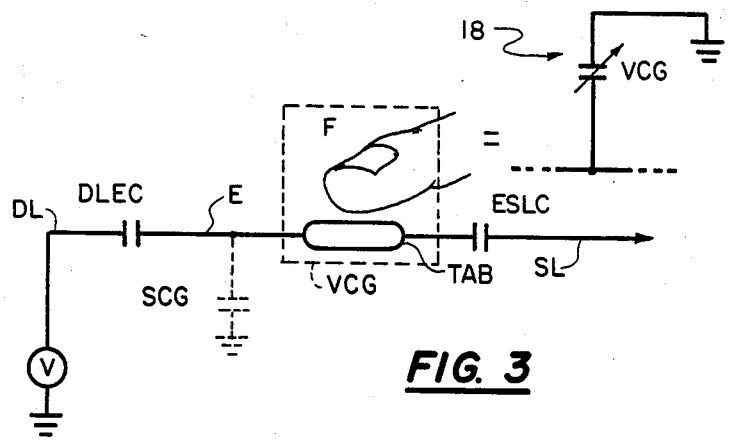
FIG. 3 is a schematic circuit diagram illustrating the theory of touch detection in the touch sensing array of the system of FIG. 1.

The theory of touch detection is described with reference to FIG. 3, wherein a tab of an electrode is shown. A drive line DL is capacitively coupled to the electrode E by the drive line-to-electrode capacitance DLEC; and the electrode E is capacitively coupled to a sense line SL by an electrode-to-sense line capacitance ESLC. A drive signal is provided on the drive line DL by a drive signal source V to drive the electrode E. A variable capacitance to ground (VCG) is produced in accordance with the proximity to the tab of an operator's finger F, as shown in the equivalent circuit 18. There is also a stray capacitance from the electrode E to ground as represented by the capacitor SCG.

When a drive signal (DS) consisting of an applied AC voltage is placed on the drive line DL to drive the electrode E, a sense signal (SS) is provided on the sense line SL. The amplitude of the sense signal on the sense line SL is dependent upon whether the capacitance between the driven electrode E and circuit ground is varied by an operator touching the tab. When the operator touches the tab (or even moves his finger F in close proximity to the tab) the variable capacitance to ground VCG increases to thereby cause the amplitude of the sense signal on the sense line SL to decrease. By providing appropriate means for processing the sense signal provided on the line SL, it is possible to ascertain when the tab has been touched by an operator.

Figure 4:
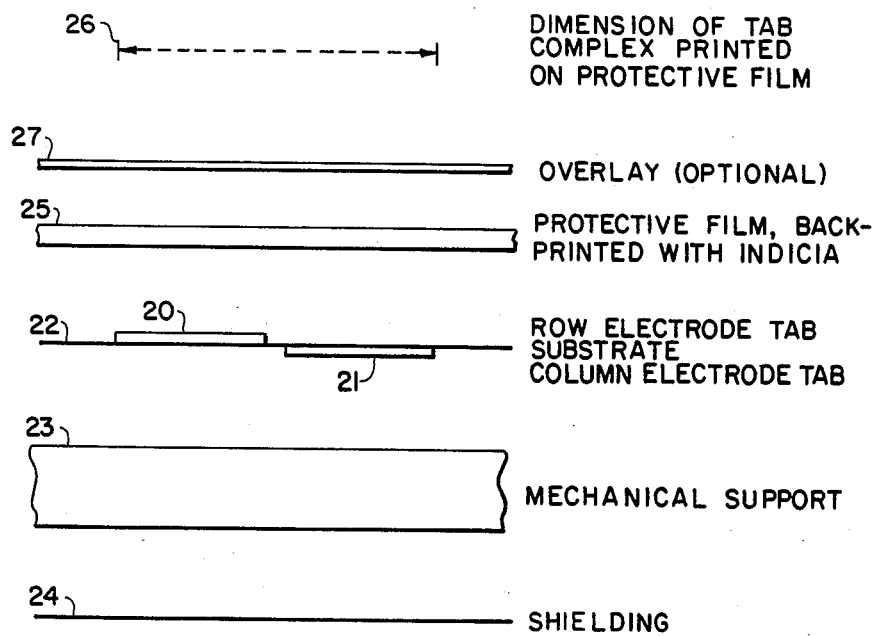
FIG. 4 is a schematic exploded cross-sectional diagram illustrating the construction of one preferred embodiment of the touch sensing array of the system of FIG. 1.

A preferred construction of the touch sensing array 10 in this embodiment is shown in FIG. 4. Each tab complex TC includes two conductive tabs 20 and 21 that are respectively parts of different electrodes. One tab 20 is supported on one side of a thin (0.001 inch) dielectric Mylar film substrate 22 and the other tab 21 is supported on the other side of the thin dielectric substrate 22.

Figure 5:
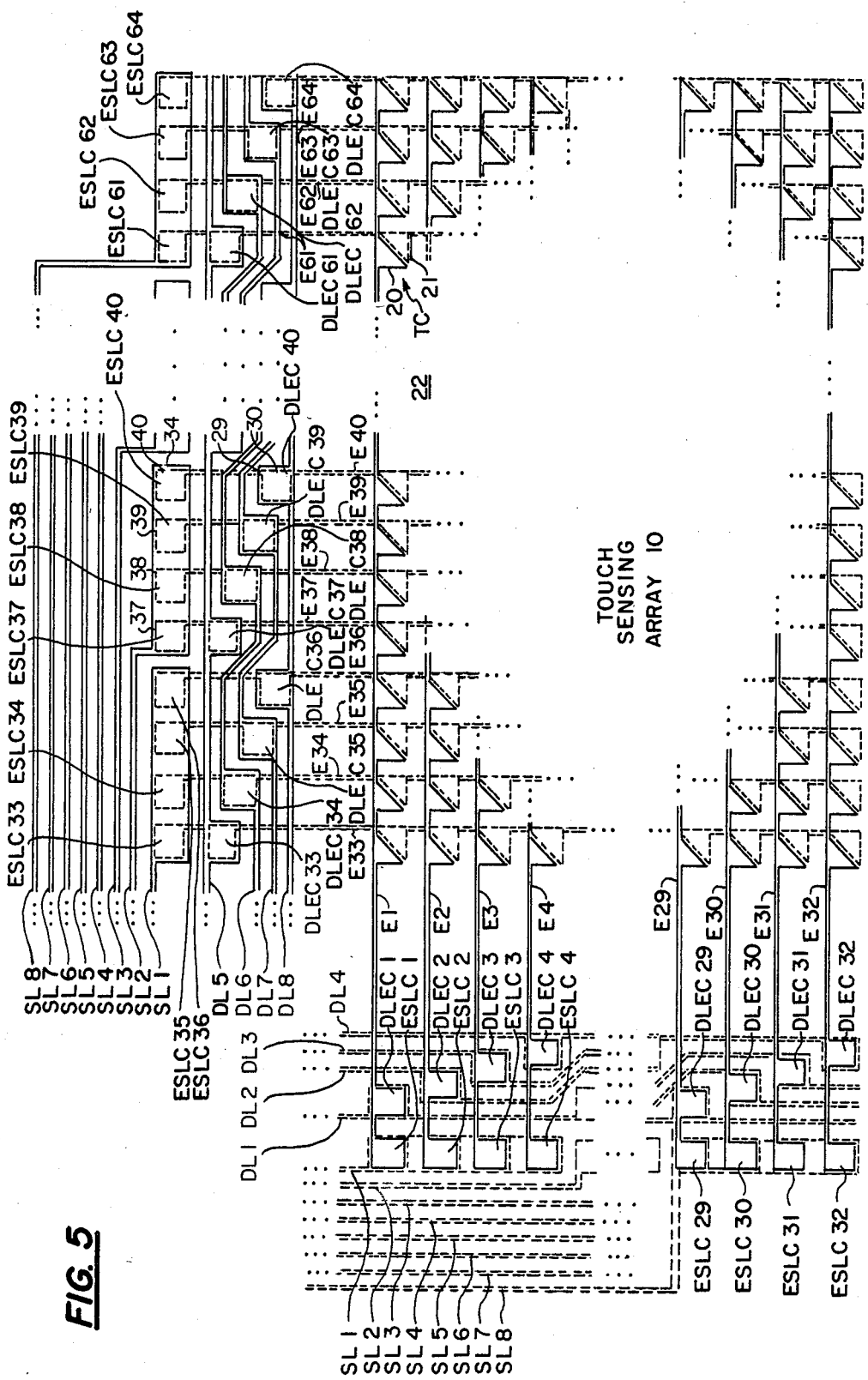
FIG. 5 is a partial plan view illustrating the construction and interconnection of the drive lines, electrodes, and sense lines and the tabs of the electrodes in one preferred embodiment of the system of FIG. 1.

Referring to FIG. 5, it is seen that the row electrodes E1-32 (represented by solid lines) are supported on the top side of the substrate 22, and that the column electrodes E33-64 (represented by broken lines) are supported on the bottom side of the substrate 22. Each top-side tab 20 is an enlarged portion of a row electrode; and each corresponding bottom-side tab 21 of the same tab complex is an enlarged portion of a column electrode and is adjacent to the position underlying the top-side tab 20 so that the capacitance between both electrodes having the respective tabs 20 and 21 and ground is varied when the touch sensing array is touched by an operator in the proximity of the tab complex comprising tabs 20 and 21.

Referring again to FIG. 4, the dielectric substrate 22 is supported by a nonconductive mechanical support layer 23, which is covered on its bottom-side by a grounded conductive, electrically-shielding layer 24. The touch sensing array further includes a protective 0.005 inch Lexan plastic film layer 25 covering the unsupported side of the substrate 22 and the tab 20. The protective film layer 25 is backprinted with indicia associated with each of the tab complexes in order to identify the tab complexes as underlying keys which are the touch responsive areas in a keyboard. The dashed line 26 shows the dimension of an outline of the tab complex that is backprinted on the protective film 25. Optionally, the touch sensing array may also include a paper overlay layer 27 having different indicia than the backprinted indicia when it is desired to use the touch sensing array in an application in which the backprinted indicia are not appropriate.

FIG. 4 illustrates the relative placement of the constituents of the touch sensing array only; and the thicknesses of the layers 22, 23, 24, 25, and 27 are not proportionate. In this preferred embodiment the mechanical supporting layer 23 is 0.25 inch thick. It will be readily appreciated that decreasing the thickness of this supporting layer 23 will increase the proximity of the grounded shielding layer 24 to each of electrodes E1-64 thereby increasing the stray capacitances to ground SCG of each of E1-64. The entire touch sensing array 10 is part of a monolithic construction that also includes the drive line-to-electrode capacitors DLEC1-64 and the electrode-to-sense line capacitors ESLC1-64.

The width of each of the respective electrodes E1-64 is very narrow (0.02 inch) in areas where a row electrode E1-32 on one side of the substrate 22 crosses the position of a column electrode E33-64 on the opposite side of the substrate 22 in order to minimize capacitive coupling between electrodes on opposite sides of the substrate 22.

Referring again to FIG. 5, both the drive lines DL1-8 and the sense lines SL1-8 are supported by the same thin dielectric substrate 22 as supports the electrodes E1-64 and the tab complexes TC. The row drive lines DL1-4 (represented by broken lines) are supported on the bottom side of the substrate 22; and the column drive lines DL5-8 (represented by solid lines) are supported on the top side of the substrate 22.

Each of drive lines DL1-8 on one side of the substrate 22 is coupled to electrodes on the opposite side of the substrate 22 by the drive line-to-electrode capacitors DLEC1-64. Each capacitor includes a first plate supported by one side of the substrate 22 and extending from the drive line and a second oppositely disposed plate supported by the other side of the substrate 22 and extending from the coupled electrode. For example, consider drive line-to-electrode capacitor DLEC40 which includes a first plate 29 supported on the top side of the substrate 22 and extending from column drive line DL8 on the top side of the substrate 22 and a second oppositely disposed plate 30 supported on the bottom side of the substrate 22 and extending from column electrode E40 on the bottom side of the substrate 22.

The sense lines SL1-8 are supported on both sides of the substrate 22, as may be discerned from the representative respective solid and broken lines in FIG. 5. The row electrodes E1-32 on the top side of the substrate 22 are capacitively coupled to the portions of eight sense lines SL1-8 on the bottom side of the substrate 22 respectively by thirty-two of the electrode-to-sense line capacitors, ESLC1-32. Each of the eight sense lines is capacitively coupled to four of the row electrodes. The column electrodes E33-64 of the bottom side of the substrate 22 are capacitively coupled to the portions of the eight sense lines SL1-8 on the top side of the substrate 22 respectively by the remaining thirty-two electrode-to-sense line capacitors, ESLC33-64. Each such capacitor includes a first plate supported by one side of the substrate 22 and extending from the electrode and a second plate supported by the other side of the substrate 22 and extending from the coupled sense line, such as shown for capacitors ESLC1-4. This condition is also satisfied by capacitors ESLC37-40 wherein a capacitor plate on one side of the substrate constitutes the first plate for several different capacitors that are defined by separate second plates on the opposite side of the substrate. In capacitors ESLC37-40, a first plate 34 supported on the top side of the substrate 22 and extending from the sense line SL2 supported on the top side of the substrate 22 is in common to each of these capacitors ESLC37-40, and separate second plates 37, 38, 39 and 40 are supported on the bottom side of the substrate 22 and respectively extend from the electrodes E37, E38, E39, and E40 supported on the bottom side of the substrate 22.

Table 1 shows which one of the drive lines DL1-8 and which one of the sense lines SL1-8 are respectively coupled to each of the electrodes E1-64. No given drive line and sense line pair is connected to more than one electrode in common.

TABLE 1

| | | Electrode Number | | | | | | | |
|---|---|---|---|---|---|---|---|---|---|
| | | SL1 | SL2 | SL3 | SL4 | SL5 | SL6 | SL7 | SL8 |
| ROW | DL1 | 1 | 5 | 9 | 13 | 17 | 21 | 25 | 29 |
| DRIVE | DL2 | 2 | 6 | 10 | 14 | 18 | 22 | 26 | 30 |
| LINES | DL3 | 3 | 7 | 11 | 15 | 19 | 23 | 27 | 31 |
| | DL4 | 4 | 8 | 12 | 16 | 20 | 24 | 28 | 32 |

TABLE 1-continued

| | | Electrode Number | | | | | | | |
|---|---|---|---|---|---|---|---|---|---|
| | | SL1 | SL2 | SL3 | SL4 | SL5 | SL6 | SL7 | SL8 |
| COLUMN | DL5 | 33 | 37 | 41 | 45 | 49 | 53 | 57 | 61 |
| DRIVE | DL6 | 34 | 38 | 42 | 46 | 50 | 54 | 58 | 62 |
| LINES | DL7 | 35 | 39 | 43 | 47 | 51 | 55 | 59 | 63 |
| | DL8 | 36 | 40 | 44 | 48 | 52 | 56 | 60 | 64 |

Figure 6:
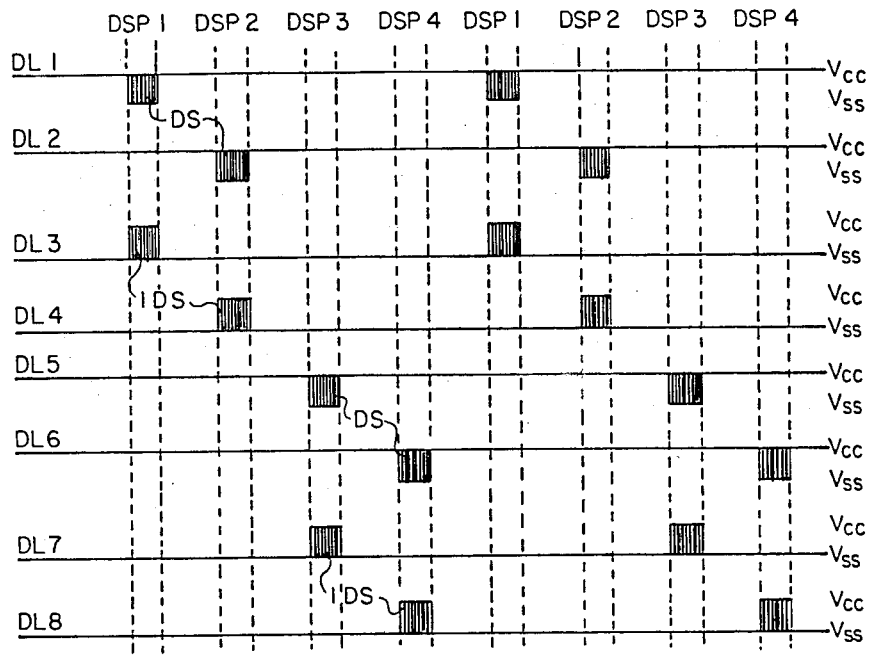
FIG. 6 illustrates the timing and polarity of the different drive signal patterns applied to the drive lines by the drive signal generator in one preferred embodiment of the system of FIG. 1.

Referring again to FIG. 1, drive signals are applied to the drive lines DL1-8 by the drive signal generator 17. The drive signal generator 17 is adapted to respond to drive signal timing information provided on line 41 from the control logic circuit 16 and to drive signal pattern information provided on lines 42 from the microprocessor 15 by repetitively applying a sequence of drive signals having different predetermined characteristics to the different drive lines DL1-8 to cause differently characterized sense signals to be derived on sense lines SL1-8 coupled to a plurality of different electrodes E1-64. The drive signal on each drive line is a periodic occurence of an alternating signal packet that occurs at a time when one other drive line has a synchronously occuring alternating signal packet of opposing polarity. Referring to FIG. 6, each signal packet contains sixteen cycles of an alternating signal that varies at a predetermined frequency. At any one time, the signals on the drive lines consist of alternating signal packets simultaneously applied to a signal pair of drive lines, with the paired signal packets being synchronous with each other, of approximately the same value, and of opposing polarities to thereby cause the amplitude of the sense signals derived in response to such synchronous pairs of drive signal packets to be low in relation to the variation in the amplitude of such sense signals resulting from the keys being touched by an operator. Further means of providing that each of the sense signals is of small amplitude in the absence of operator touch are described in conjunction with Table 3 and thereafter in conjunction with Table 6.

Each of the drive signal packets of one polarity is referred to as drive signal DS; and each of the drive signal packets of the opposite polarity is referred to as inverted drive signal IDS. In the context of this Specification when no distinction is made between the drive signal DS and the inverted drive signal IDS, the term drive signal refers to whichever type of drive signal pattern (DS or IDS) is applied.

Referring again to FIG. 6, the drive signals are provided on the drive lines DL1-8 by the drive signal generator 17 in a repeating sequence of four different drive signal patterns DSP1, DSP2, DSP3, and DSP4. During DSP1, a drive signal DS is provided on drive line DL1 and an inverted drive signal IDS is provided on drive line DL3. Table 2 shows the pair of drive lines from DS1-8 receiving respectively the drive signal DS and the inverted drive signal IDS during each of the four different drive signal patterns DSP1-4.

TABLE 2

| | DSP1 | DSP2 | DSP3 | DSP4 |
|---|---|---|---|---|
| LINE RECEIVING DS | DL1 | DL2 | DL5 | DL6 |
| LINE RECEIVING IDS | DL3 | DL4 | DL7 | DL8 |

TABLE 2-continued

| DSP1 | DSP2 | DSP3 | DSP4 |
|---|---|---|---|

Location of DS and IDS on DL1-8 during DSP1-4

During each drive signal pattern, the paired drive signal DS and inverted drive signal IDS occur simultaneously and are synchronous with each other, of approximately the same value, and of opposing polarities.

The drive signal pattern information on lines 42 indicates the sequence in which the drive signal packets are placed upon given drive lines. Each of the drive lines DS1-8 is dedicated to receiving either drive signal DS or inverted drive signal IDS exclusively, as shown in FIG. 6.

Referring again to FIG. 1, the multiplexer 11 time-division multiplexes the eight different sense signals on sense lines SL1-8 to provide time-division multiplexed sense signals on line 43 to the amplifier 12. The amplifier 12 is a band pass amplifier centered at the predetermined frequency of the alternating signal within the signal packets of the drive signals. The synchronous demodulator frequency demodulates the signal on line 44 from the amplifier 12. The control logic circuit 16 controls the operation of the synchronous demodulator 13 by a signal on lines 45 to cause the demodulation of a signal packet on line 44 to be synchronous with the generation of the corresponding drive signal packet by the drive signal generator 17. The demodulated signals then are converted from analog signals to digital signals by the A/D converter 14 which provides a respective sense signal value (SSV) on lines 46 for the sense signal derived from one of the sense lines SL1-8 that is selected by the multiplexer 11 during one of drive patterns DSP1-4 (FIG. 6). The multiplexing rate is such that a sense signal from only one of the sense lines SL1-8 is provided on line 43 and subsequently demodulated during each occurrence of a drive signal pattern DSP. The sense signal values indicate both the amplitude and the polarity of the sense signals. Because opposing polarity drive signal patterns are provided, the number of sense signal values that must be processed to scan completely the touch sensing array is one-half the number of electrodes. Thus, for this embodiment, only thirty-two sense signal values need be processed during each complete scan of the touch sensing array. In this embodiment, the A/D converter 14 is an 8-bit A/D converter yielding a number between 0 and 255. The synchronous demodulator 13 is biased so that a mid-range sense signal value of 128 is obtained when no drive signals are applied to the drive lines, and consequently no drive signals are transmitted to the sense lines, during a period of A/D conversion.

Table 3 shows a processing sequence identification number for each of the sense signal values SSV1-32 and the sign, under an appropriate choice of polarity for DS and IDS, of the variation in the sense signal value derived from each of the sense lines SL1-8 during each of the respective drive signal patterns DSP1-4 whenever a key is touched by an operator with respect to the electrodes E1-64 that supply the tabs of the tab complex of the key.

TABLE 3

| | ROW | | | | | | COLUMN | | | | | |
|---|---|---|---|---|---|---|---|---|---|---|---|---|
| | DSP1 | | | DSP2 | | | DSP3 | | | DSP4 | | |
| | SSV | SIGN | E | SSV | SIGN | E | SSV | SIGN | E | SSV | SIGN | E |
| SL1 | 1 | + | 1 | 9 | + | 2 | 17 | + | 33 | 25 | + | 34 |
| | | − | 3 | | − | 4 | | − | 35 | | − | 36 |
| SL2 | 2 | + | 5 | 10 | + | 6 | 18 | + | 37 | 26 | + | 38 |
| | | − | 7 | | − | 8 | | − | 39 | | − | 40 |
| SL3 | 3 | + | 9 | 11 | + | 10 | 19 | + | 41 | 27 | + | 42 |
| | | − | 11 | | − | 12 | | − | 43 | | − | 44 |
| SL4 | 4 | + | 13 | 12 | + | 14 | 20 | + | 45 | 28 | + | 46 |
| | | − | 15 | | − | 16 | | − | 47 | | − | 48 |
| SL5 | 5 | + | 17 | 13 | + | 18 | 21 | + | 49 | 29 | + | 50 |
| | | − | 19 | | − | 20 | | − | 51 | | − | 52 |
| SL6 | 6 | + | 21 | 14 | + | 22 | 22 | + | 53 | 30 | + | 54 |
| | | − | 23 | | − | 24 | | − | 55 | | − | 56 |
| SL7 | 7 | + | 25 | 15 | + | 26 | 23 | + | 57 | 31 | + | 58 |
| | | − | 27 | | − | 28 | | − | 59 | | − | 60 |
| SL8 | 8 | + | 29 | 16 | + | 30 | 24 | + | 61 | 32 | + | 62 |
| | | − | 31 | | − | 32 | | − | 63 | | − | 64 |

For example, if the tab complex with a tab from row electrode E1 and a tab from column electrode E48 is touched by an operator, a positive variation in the sense signal value is derived from sense line SL1 during DSP1 and a negative variation in the sense signal value is derived from sense line SL4 during DSP4 provided that the polarity of drive signal DS is such that a decrease in the amount of the drive signal DS appearing on the appropriate sense line during a drive signal pattern results in a positive variation in the sense signal value.

During manufacture of the touch sensing array system, Table 3 can be referred to in trimming drive line-to-electrode capacitors and/or electrode-to-sense line capacitors. The object of this trimming step is to balance the transmitted drive signal DS and inverted drive signal IDS appearing on each sense line during each one of DSP1-4. In this embodiment, a sense signal value of 128 is indicative of perfect balancing of DS and IDS on a sense line during a drive signal pattern. As an example, if SSV15 is found to be 151 in the absence of operator touch, trimming either the drive line-to-electrode capacitor DLEC28 or the electrode-to-sense line capacitor ESLC28 is seen, on consulting Table 3, to make the value of SSV15 smaller. Balancing of the entire touch sensing array system of this embodiment proceeds by iterating a trimming procedure in which, for each k between 1 and 32, the difference between SSVk and 128, if exceeding in magnitude a predefined tolerance value, is reduced by half by trimming the appropriate DLEC and/or ESLC on consulting Table 3. Thus, the trimming is terminated when each of SSV1-32 is within the predefined tolerance of the target value 128 in the absence of operator touch. An iterative method of trimming is preferred since, in the presence of stray capacitive coupling, the trimming of DLEC and/or ESLC of a particular electrode may produce changes in sense signal values not associated with that electrode. During manufacture, this trimming operation is carried out when the assembly of the touch sensing array system is sufficiently advanced so that the relations of the arrays of conductors of the system to the protective layer 25, the mechanical support 23, and the shielding layer 24 of FIG. 4 are fixed.

An alternative method of attaining the desired balance of DS and IDS on each of the sense lines SL1-8 during each of DSP1-4 is discussed below beginning with the paragraph preceding Table 6.

The microprocessor 15 processes the sense signal value on lines 46 to provide information on lines 47 associated with any particular key that is touched by an operator. In this embodiment the touch sensing array 10 is used as a keyboard for a data processor 48. Accordingly, the information provided by the microprocessor on lines 47 constitutes a keyboard output signal to the data processor 48.

The operation of the multiplexer 11 is controlled by signals provided on lines 49 by the microprocessor 15. The microprocessor also produces an initialization signal on line 50 to the control logic circuit 16, which coordinates the operation of the synchronous demodulator 13, the A/D converter 14, and the drive signal generator 17. The operation of the microprocessor 15 is reset by the data processor 48 by a signal on line 51.

The microprocessor 15 is programmed to process the sense signal values (SSV) on lines 46 iteratively to ascertain the signs and values of the variations (SSVV) in the sense signal values (SSV) and to process the sense signal variation values (SSVV) as a group to determine whether the variations resulted from a key being touched by an operator. The flow charts for this program are shown in FIGS. 7 through 12.

The sense signal values are processed iteratively by comparing the sense signal values with baseline values derived from sense signal values provided when the touch sensing array is untouched by an operator to determine which one of three states is present. The first of the three states is an UNTOUCHED state. The second of the three states is a VALID TOUCH state in which a valid touch by an operator is present. The third of the three states is an INVALID RESPONSE state which occurs when neither the first state or the second state is present.

Figure 7:
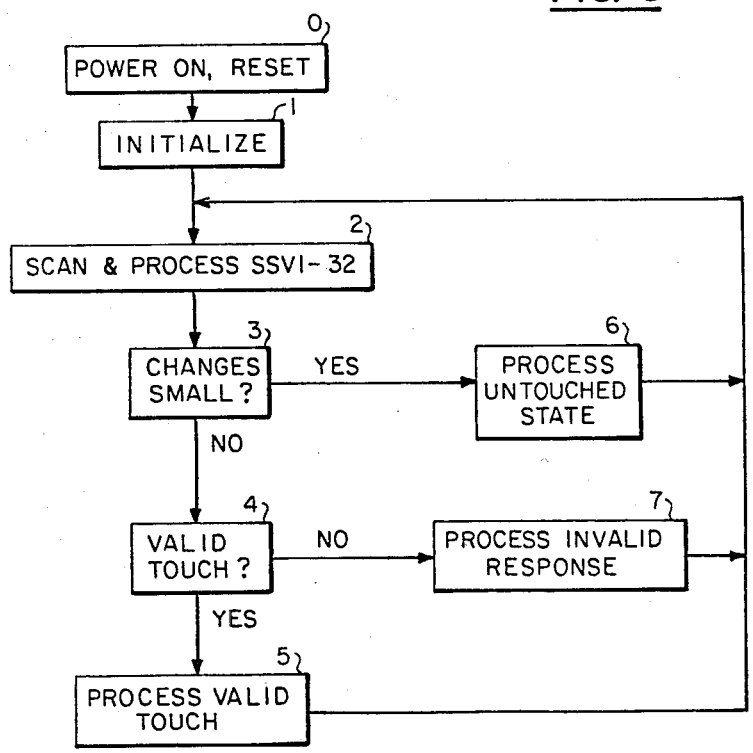

Referring to FIG. 7, step 0 represents a power on, reset operation; and in step 1, the variable values are initialized. In step 2, a scan of the touch sensing array 10 is carried out with the production of sense signal values SSV1-32 as program input. Initial processing is carried out. In step 3, a test is performed to determine if the sense signal variation values SSVV1-32 are all small. If so, the program branches to step 6 where the UNTOUCHED state is processed. If any of SSVV1-32 is found not to be small in step 3, the program branches to step 4 where a test is performed to identify the presence or absence of the VALID TOUCH state. The VALID TOUCH state is processed in step 5. In the absence of the VALID TOUCH state the program branches from step 4 to step 7 where an INVALID RESPONSE is processed. Following each of steps 5, 6, or 7 there is a return to step 2.

Expansions of steps 1 through 7 of FIG. 7 are shown in FIGS. 8 through 12, with a step numbering system which agrees in the first digit with that of FIG. 7.

Figures 8, 9:
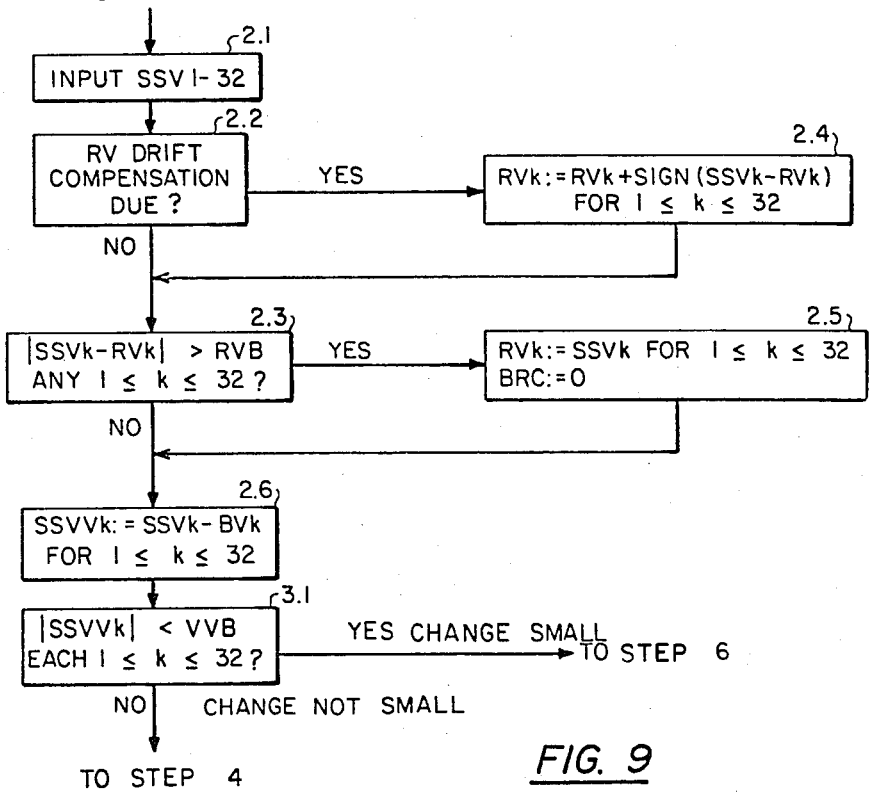

Referring to FIG. 8, the initialization is shown in steps 1.1 and 1.2 to consist of inputting the sense signal values SSV1-32 and storing these values as baseline values BV1-32 and also as reserve values RV1-32. Next, a baseline drift compensation count (BDCC) and a baseline revision count (BRC) are each initialized to zero. In step 1.2 and in later steps, the "assign" symbol := is used in the usual way to indicate that the value to the right of said symbol is assigned to the variable to the left of said symbol. It is intended in operation that baseline values represent the sense signal values that would be obtained in the absence of operator touch and thus that the touch sensing array 10 should be untouched during initialization.

Referring to FIG. 9, the microprocessor 15 is programmed to process SSV1-32 to determine whether any of the keys has been touched by an operator by comparing SSV1-32 with the respective BV1-32 derived from the corresponding SSV1-32 provided when the keys are untouched by an operator to determine whether any of the sense signal variation values SSVV1-32 derived from such comparison exceeds a predetermined variation value bound (VVB); and to revise BV1-32 in response to sensed variations in SSV1-32 over a predetermined number of iterations (each iteration corresponds to a sequence in which each of drive signal patterns DSP1-4 is repeated for each of the sense lines SL1-8) occurring in the absence of valid touch by an operator. The baseline values are revised in response to sensed variations in the sense signal values which are stable over a predetermined number of iterations and which indicate the INVALID RESPONSE state of the touch sensing array 10.

In the course of revising the baseline values BV1-32, the microprocessor 15 (a) stores a set of reverse values RV1-32 derived from a set including each of the respective sense signal values SSV1-32; (b) compares each sense signal value to each corresponding reserve value; (c) revises the stored set of RV1-32 to correspond to a current set of SSV1-32 whenever the difference between any one of the sense signal values and the corresponding one of the reserve values exceeds a predetermined reserve value bound (RVB); (d) processes sense signal variation values SSVV1-32 derived from a current set of SSV1-32 whenever any one of SSVV1-32 derived from such set exceeds VVB to determine whether VVB was exceeded as a result of a key being touched by an operator; (e) increments the baseline revision count BRC in response to each current set of SSV1-32 for which it is determined that the exceeding of VVB was not the result of a key being touched by an operator; (f) resets BRC to zero each time the stored set of RV1-32 is revised; and (g) revises BV1-32 to correspond to RV1-32 when BRC equals a predetermined baseline revision count limit (BRCL). Step (d) is shown in the flow chart of FIG. 10 and steps (e) and (g) are shown in the flow chart of FIG. 12. Accordingly, it is seen that the baseline values are revised to correspond to the reserve values when the INVALID RESPONSE state is present for a predetermined number of iterations during which time no revision of the reserve values occurs, no revision of baseline values to correspond to reserve values occurs, and the VALID TOUCH state is not present. It is also seen that the baseline values are updated by either incrementing or decrementing each of the respective baseline values in accordance with whether the baseline value is less or greater than the respective last-provided sense signal value when the UNTOUCHED state is present for a predetermined number of consecutive iterations during which time no updating of the baseline values occurs.

Sense signal values SSV1-32 are input in step 2.1. Next, in step 2.2 a test is done on the baseline revision count BRC. At certain preselected and fixed values of BRC there is a branch to step 2.4 where each of the reserve values RV1-32 is altered as shown so as to become closer by one if possible to the respective value of SSV1-32. The SIGN function is employed in this step and in later steps in the usual way where the SIGN of a positive number is plus one, the SIGN of zero is zero, and the SIGN of a negative number is minus one. This operation of step 2.4 is called reserve value drift compensation. Part of the significance of the operation of step 2.4 is shown by the test in step 2.3 where if any of RV1-32 is found to depart by more than the reserve-value bound RVB from the corresponding value among SSV1-32 there is a branch to step 2.5 where all of RV1-32 are given the respective values of the current SSV1-32 and where BRC is reset to zero. In step 2.6 the sense signal variation values SSVV1-32 are calculated as the respective differences of SSV1-32 and BV1-32. In step 3.1, if the magnitude of each of SSVV1-32 is found to be smaller than the variation value bond VVB, the touch sensing array 10 is judged to be in the UNTOUCHED state and there is a branch to step 6. Otherwise there is a branch to step 4.

Referring next to FIG. 10, in the course of processing SSVV1-32 the microprocessor 15 (a) in a feature extraction stage determines whether the maximum of the group of variation values derived from the row electrodes E1-32 (ROWMAX) exceeds a predetermined threshold value (THR); (b) in a confirmation stage determines whether none of the other variation values derived from E1-32 exceeds a tolerance value (TOL) that is a predetermined fraction of ROWMAX; (c) in a feature extraction stage determines whether the maximum of the group of variation values derived from the column electrodes E33-64 (COLMAX) exceeds THR; and (d) in a confirmation stage determines whether none of the other variation values derived from E33-64 exceeds a tolerance vlaue TOL that is a predetermined fraction of COLMAX. All of the four immediately preceding recited determinations (a), (b), (c) and (d) being affirmative indicates that the maximum variation value ROWMAX derived from the row electrodes and the maximum variation value COLMAX derived from the column electrodes each resulted from only a single one of the keys being touched instantaneously by an operator.

Tests for a valid touch response are carried out in steps 4.1 through 4.6. The variable ROWMAX is always assigned the value of the largest magnitude of the current set of sense signal variation values SSVV1-16 derived from the row electrodes E1-32. In step 4.1 ROWMAX is compared to the predetermined threshold value THR. If ROWMAX exceeds THR there is a branch to step 4.2 where the tolerance value TOL is set to some fixed fraction of the value of ROWMAX. Next, in step 4.3 each of the magnitudes of SSVV1-16 other than the one chosen as ROWMAX is compared to TOL. If none of these values exceeds TOL then a VALID ROW TOUCH response is judged to be present and the program branches to step 4.4 where the largest magnitude COLMAX of the current set of sense signal value variations SSVV17-32 derived from the column electrodes E33-64 is determined. COLMAX is compared to THR. If COLMAX exceeds THR, then TOL is recalculated as a fixed fraction of COLMAX in step 4.5; and in step 4.6, each of the magnitudes of SSVV17-32 other than the one chosen as COLMAX is compared to TOL. If none of these values exceeds TOL, the tests for a VALID TOUCH have been passed and there is an exit to steps 5.1 and 5.2 where a VALID TOUCH is processed. Failing any of the tests of steps 4.1, 4.3, 4.4, or 4.6 causes a branch to step 7 where an INVALID RESPONSE is processed. In step 5.1 which begins the processing of a valid touch, the counts BDCC and BRC are each reset to zero. The significance of these resets will be appreciated when the program flow charts shown in FIGS. 11 and 12 are described. In step 5.2 further processing of a VALID TOUCH response is carried out including the appropriate encoding of the touched key by row number and by column number which numbers may be calculated using the information in Table 3.

It is to be understood that the separate processing of sense signal variation values SSVV1-16 derived from row electrodes and of sense signal variation values SSVV17-32 derived from column electrodes as described in conjunction with FIG. 10 is appropriate to the present embodiment with drive signal patterns DSP1-4 of Table 2 and with the geometric layout of the conducting arrays SL1-8, DL1-8, and E1-64 of FIG. 5 where none of DL1-8 is a drive line for both a row electrode and a column electrode. In other embodiments, the patterns of variation values characteristically associated with touch may differ and in particular may not allow separate processing of the row and column sense signal values.

Referring to FIG. 11, the microprocessor 15 is further programmed to compensate for drift in the sense signal values SSV1-32 that are provided when the touch sensing array is in the untouched state. To effect such compensation, the microprocessor 15 (a) increments the baseline drift compensation count BDCC in response to each current set of sense signal values SSV1-32 in which none of the sense signal variation values SSVV1-32 exceeds the variation value bound VVB; (b) revises the baseline values BV1-32 when the baseline drift compensation count BDCC equals or exceeds a predetermined baseline drift compensation count limit (BDCCL) by adding to BVk the SIGN of the SSVk for each k between 1 and 32; and (c) resets the baseline drift compensation count BDCC to zero upon the baseline values being revised.

The processing of the UNTOUCHED state is shown in steps 6.1 through 6.4. In step 6.1 BDCC is incremented by two counts. Next, in step 6.2, BDCC is compared to the predetermined BDCCL. If BDCC has reached or exceeded BDCCL, there is a branch to step 6.3 where BDCC is reset to zero. Next, in step 6.4 each of BV1-32 is altered as shown so as to become closer by one if possible to the respective value of the current SSV1-32.

Referring to FIG. 12, the process of compensating for baseline value drift further includes decrementing the baseline drift compensation count BDCC to not less than zero in response to each current set of sense signal values SSV1-32 for which at least one of the variation values SSVV1-32 exceeds the predetermined variation value bound VVB except when it is determined that the exceeding of VVB was the result of a key being touched by an operator. When the INVALID RESPONSE state occurs only intermittently, the updating of the baseline values is delayed by degree. In step 7.1 the baseline revision count BRC is incremented. Next, BDCC is decremented if BDCC is greater than zero. Next, in step 7.2 BRC is compared to the predetermined baseline revision count limit BRCL. If there is equality there is a branch to step 7.4 where the baseline values BV1-32 are assigned the respective reserve values RV1-32, as discussed above in relation to the description of the program flow chart shown in FIG. 9. Further processing of the INVALID RESPONSE state is carried out in step 7.3 as needed.

Referring again to the program flow chart of FIG. 7, it is seen that baseline value drift compensation occurs in step 6, where the UNTOUCHED state is processed, when BDCC reaches BDCCL. BDCC is reset to zero in step 5, incremented by two in step 6, and is decremented by one if positive in step 7. Since there is passage through only one of steps 5, 6, or 7 during each iteration, the condition which brings about baseline value drift compensation is apparent. Also it is seen that complete baseline revision with the resulting replacement of BV1-32 by RV1-32 occurs in step 7, where the INVALID RESPONSE state is processed, when BRC reaches BRCL. BRC is incremented in step 7, is reset to zero in step 5, and is possibly reset to zero in step 2. Thus the conditions needed for complete baseline value revision are apparent: first, sufficient stability of SSV1-32 so that the resetting of BRC is avoided in step 2, and second, passage through step 7 BRCL times before passing through step 5.

Further processing of VALID TOUCH or INVALID RESPONSE beyond that indicated in the flow charts of FIGS. 7-12 may proceed according to well-established techniques in keyboard scanner design.

All numbers are stored in the microprocessor 15 as 8-bit binary numbers and the sense signal variation values SSVV1-32 are encoded as signed binary numbers lying between decimal minus 128 and decimal 127. It is assumed that, in normal use, changes in each of SSV1-32 will not exceed decimal 127 in magnitude and thus that the sign of such changes will be given a correct interpretation in the microprocessor program.

As an example of program parameter choices, suppose that sense signal variation values of over 16 units are reliably produced by operator touch under typical operating conditions. THR may be set equal to 8. RVB and VVB may be set equal to 4. BDCCL may be chosen so that baseline value drift compensation occurs at the rate of one per second when all SSV1-32 are consistently less than or equal to VVB in magnitude. In the process of FIG. 10 in step 4.2 TOL may be assigned the value of ROWMAX/4 and in step 4.5 TOL may be assigned the value of COLMAX/4. BRCL may be chosen so that a complete baseline value revision occurs after two seconds of stabilized SSVs in the INVALID RESPONSE state. The preselected values of BRC which lead to a branch to reserve value drift compensation from step 2.2 in the process of FIG. 9 may be chosen as 1, 2, 4, 8, ... up to BRCL.

In an alternative preferred embodiment, the touch sensing array 10 is adapted so that instead of the electrodes serving to form keys of a keyboard, an array of electrodes is dimensioned and disposed so that an operator firmly touching the interior area of a touch responsive panel overlying and coextensive with the electrode array with his finger necessarily varies the capacitance to ground of a plurality of electrodes simultaneously. In this alternative embodiment the microprocessor 15 is programmed to response so as to provide an output indication of the coordinate position on the touch sensing arry 10 that is touched by the operator. The indication of the position of finger touch may be used in a variety of control situations, such as, for example, selecting the cursor position on a cathode ray tube constituting the display portion of a computer terminal. In other applications, transparent conductive material may be used for the electrodes and the touch sensing array may overlay the cathode tube.

Figure 13:
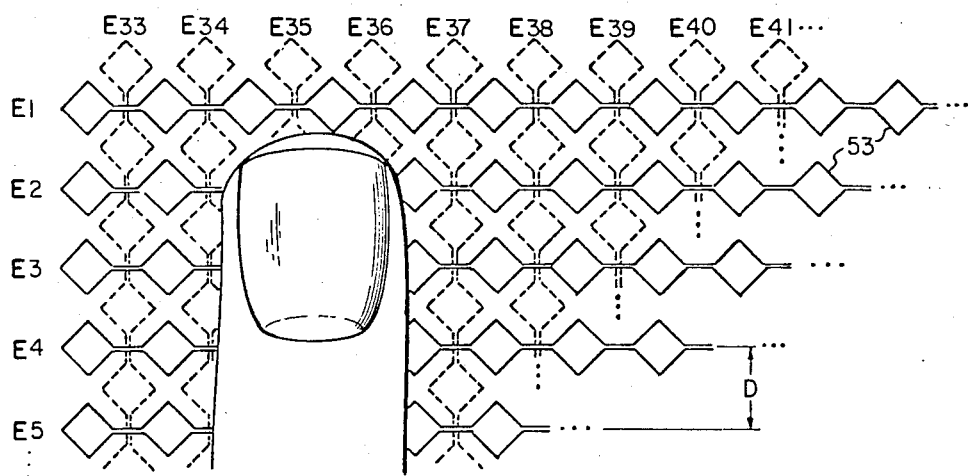
FIG. 13 is a partial plan view illustrating the construction and relationship of the electrode array and the single touch responsive area in an alternative preferred embodiment of the system of FIG. 1.

The touch sensing array of this alternative embodiment is shown in FIG. 13, where it is seen that there are row electrodes E1, . . . supported on one side of a thin dielectric substrate, and column electrodes E33, . . . supported on the opposite side of said substrate. Each electrode consists of a connected series of conductive tabs 53. The center line-to-center line distance D between the row electrodes E1, . . . is 0.25 inch. The column electrodes E33, . . . are separated by the same distance. The conductive tabs are square in shape and are connected by conductive paths which traverse the tabs diagonally. Each square has a diagonal dimension of 0.2 inch. The tabs on one side of the substrate do not underlie the tabs on the opposite side of the substrate. Instead, as shown in FIG. 13, the tabs on one side of the substrate are disposed symmetrically between the positions of the tabs on the opposite side of the substrate.

The touch sensing array of this alternative embodiment has the same basic monolithic construction as described above for the touch sensing array shown in FIG. 4. The touch responsive panel is the protective film 25, which ordinarily would be backprinted with indicia to show a coordinate grid. The use of the optional overlay 27 would be appropriate with this embodiment when it is desired to specify portions of the array as having particular significance. As in the first described preferred embodiment the entire touch sensing array 10 in this alternative preferred embodiment is a part of a monolithic construction that also includes the drive line-to-electrode capacitors DLEC1–64 and the electrode-to-sense line capacitors ESLC1–64 as described above with reference to FIG. 5.

Figure 14:
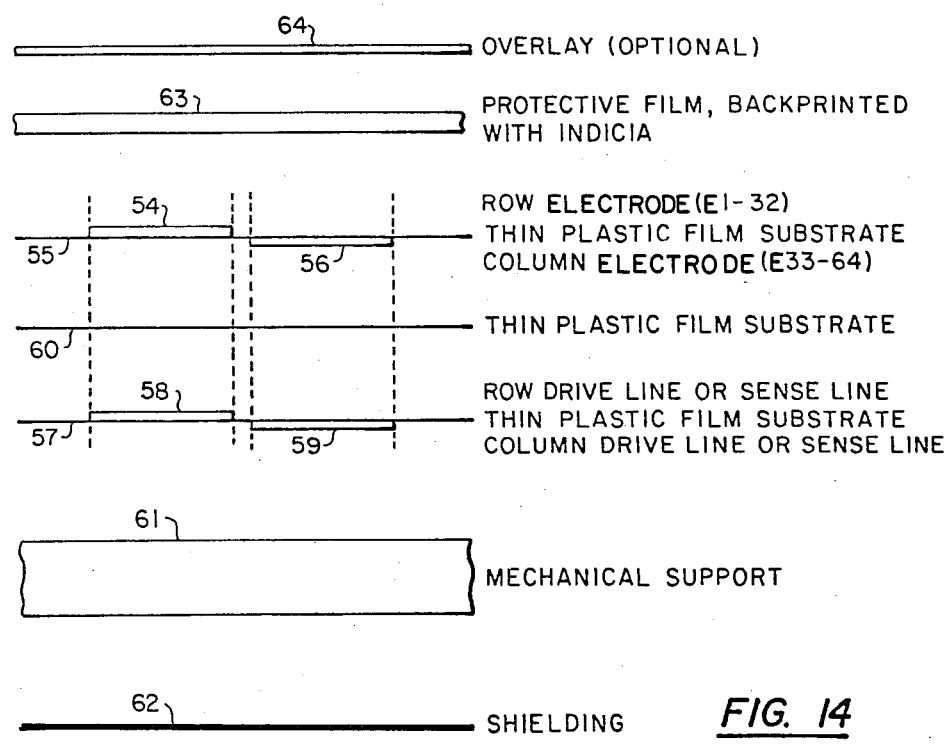
FIG. 14 is a schematic exploded cross-sectional view illustrating the construction of the touch sensing array in the alternative preferred embodiment of FIG. 13.
Figure 15:
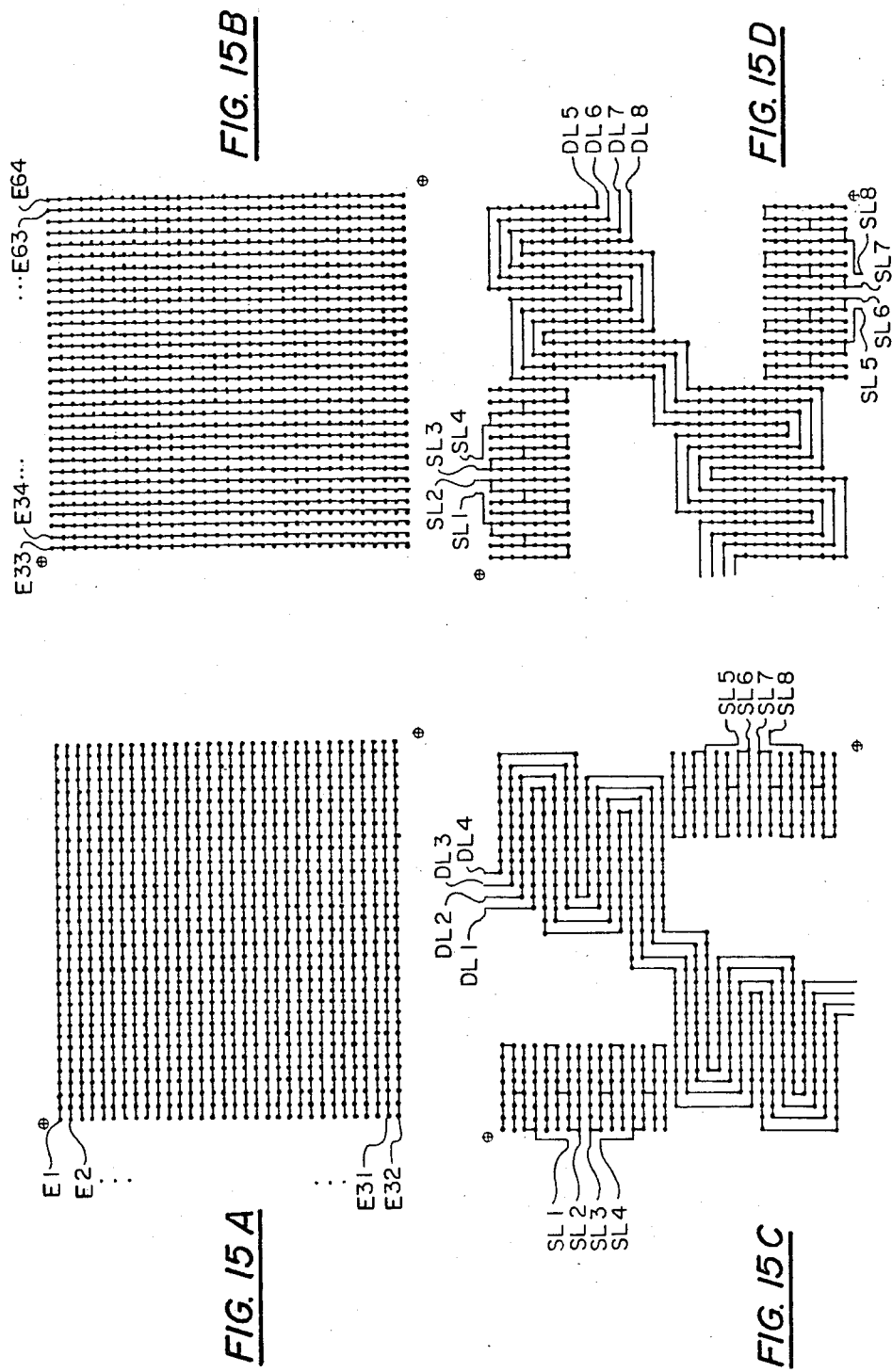
FIGS. 15A through 15D illustrate the relationship between layered arrays of electrodes, drive lines, and sense lines in the alternative preferred embodiment of FIGS. 13 and 14.

An alternative monolithic construction of the touch sensing array of FIG. 13 in combination with the drive line-to-electrode capacitors DLEC1–64 and electrode-to-sense line capacitors ESLC1–64 is shown in FIGS. 14 and 15. Referring to FIG. 14, a row electrode 54 of the array of row electrodes E1–32 is supported by the top side of a first thin dielectric Mylar film substrate 55; and a column electrode 56 of the array of column electrodes E33–64 is supported by the bottom side of the first substrate 55. The drive lines and sense lines are supported by opposite sides of a second thin dielectric Mylar film substrate 57. In the representative cross-sectional view of FIG. 14, a line 58 of either the array of row drive lines DL1–4 or the array of sense lines SL1–8 is supported by the top side of the second substrate 57; and a line 59 of either the array of column drive lines DL5–8 or the array of sense lines SL1–8 is supported by the bottom side of the second substrate 57. A third thin dielectric Mylar film substrate 60 separates the first substrate 55 and the second substrate 57. Each of these three substrates is approximately 0.001 inch thick.

FIGS. 15A, 15B, 15C and 15D show the respective layers of the arrays containing the lines 54, 56, 58 and 59 shown in FIG. 14. The registration marks in these figures indicate the alignment of the respective layers. The top layer, shown in FIG. 15A, contains the array of row electrodes E1–32. The next layer, shown in FIG. 15B, contains the array of column electrodes E33–64. The following layer, shown in FIG. 15C, contains the array of row drive lines DL1–4 and portions of the array of sense lines SL1–8. The bottom layer, shown in FIG. 15D, contains the array of column drive lines DL5–8 and portions of the array of sense lines SL1–8. When these four layers are aligned as indicated by their registration marks, each of the row electrodes E1–32 is capacitively coupled primarily to one of the row drive lines DL1–4 and to one of the sense lines SL1–8; and each of the column electrodes E33–64 is capacitively coupled primarily to one of the column drive lines DL5–8 and to one of the sense lines SL1–8. It is obvious that the alternative construction methods illustrated in FIGS. 14 and 15 are equally applicable to embodiments, such as that shown in FIG. 5, in which the touch sensing array is configured as a keyboard.

Referring again to FIG. 14, the second substrate 57 is supported by a nonconductive mechanical support layer 61, which is covered on its bottom side by a grounded conductive, electrically shielding layer 62. The touch sensing array further includes a protective 0.005 inch Lexan plastic film layer 63 covering the top unsupported side of the first substrate 55. Optionally the touch sensing array may also include a paper overlay layer 64 having various indicia and/or patterns thereon to particularly indicate specific portions of the array.

Referring again to FIG. 10, the microprocessor program for this alternative embodiment necessarily is modified in steps 4.3 and 4.6 to accommodate the fact that more than one of the row electrodes E1–32 and more than one of the column electrodes E33–64 are affected during a valid touch. The program can be modified to exempt from the tolerance test the sense signal variation values derived from the two electrodes on either side of the respective electrodes from which ROWMAX and COLMAX are derived.

The principle modification of the microprocessor program is to add a stage of processing beyond that of feature extraction and confirmation for valid touch. This modification is described with reference to FIG. 16 which illustrates a flow chart for an interpolation process for calculating an x coordinate and a y coordinate for finger touch position. In this process it is convenient to redesignate ach of the sense signal value variations SSVV1–32 as a positive part minus a negative part; where the positive part of a nonnegative number is the number itself, and the negative part of a nonpositive number is the absolute value of the number. In this way 64 variables called electrode referred variation values ERVV1–64 are obtained from the 32 sense signal variation values SSVV1–32. The two of ERVV1–64 associated with each of SSVV1–32 are obtained by consulting Table 3 with the obvious interpretation in the present context. For example: the positive and negative parts of SSVV21 are assigned to ERVV49 and ERVV51 respectively upon consulting Table 3; a value of minus twelve for SSVV21 would yield zero for ERVV49 and twelve for ERVV51; a value of fifteen for SSVV21 would yield fifteen for ERVV49 and zero for ERVV51.

Figure 16:
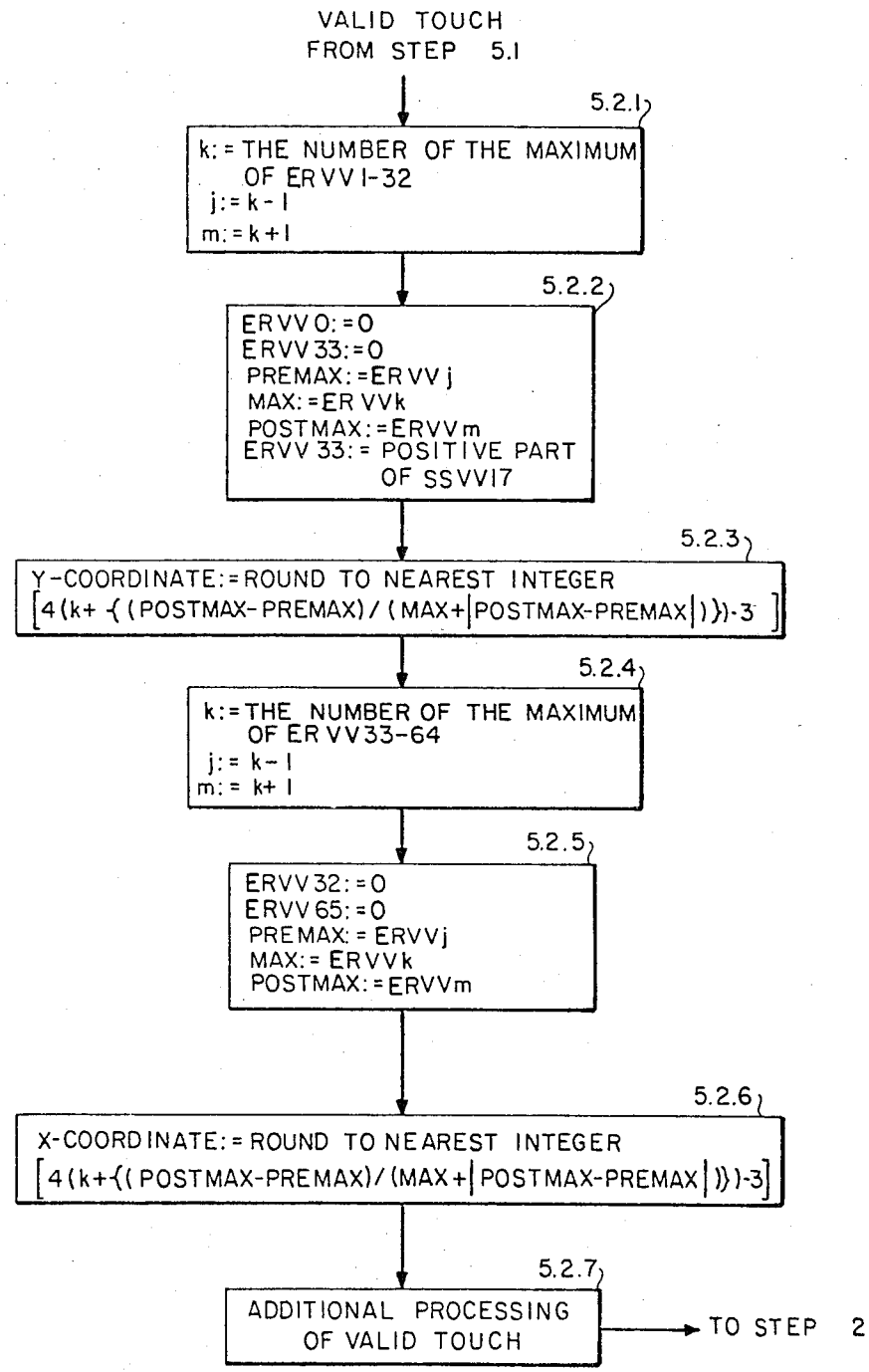
FIG. 16 is a flow chart of microprocessor programming applicable to the further preferred embodiment of FIG. 13 that is used in addition to the programming illustrated by FIGS. 7-12.

Referring to FIG. 16, the interpolation routine for estimating the y coordinate of operator finger touch position from ERVV1-32 is set forth in steps 5.2.1 through 5.2.3, and the interpolation process for estimating the x coordinate of operator touch position from ERVV33-64 is set forth in steps 5.2.4 through 5.2.6. These steps are to be considered as an expansion in this preferred embodiment of step 5.2 of the process covered by the flow chart of FIG. 10 for the first described preferred embodiment. These interpolation processes produce x and y coordinates which indicate the position of operator finger touch. Each coordinate is a number between 1 and 125.

In step 5.2.1 the variable k is assigned the number of the maximum of ERVV1-32; the variable j is assigned the value of k−1; and the variable m is assigned the value of k+1. For convenience, in step 5.2.2 a variable called ERVV0 is assigned the value zero and ERVV33 is temporarily assigned the value zero. Next, variables PREMAX, MAX, and POSTMAX are assigned the respective values ERVVj, ERVVk, and ERVVm. Following this, the value of ERVV33 is restored to the value of the positive part of SSVV17. Next, in step 5.2.3 the variable Y-COORDINATE which gives a y coordinate for finger touch position is calculated from the elementary interpolation formula:

$$Y = 4[k + \{(POSTMAX - PREMAX)/(MAX + |POSTMAX - PREMAX|)\}] - 3 \quad \text{(Eq. 1)}$$

Y is rounded to the nearest integer. It is evident that the term POSTMAX-PREMAX appearing in the interpolation formula is never greater than MAX and thus that the term (POSTMAX-PREMAX)/(MAX+|POSTMAX−PREMAX|) which is added to k always lies between minus one half and plus one half. Next in steps 5.2.4 through 5.2.6 the interpolation routine of steps 5.2.1 through 5.2.3 is repeated with obvious modifications to calculate the variable X-COORDINATE. In steps 5.2.7 additional processing of VALID TOUCH by methods well known to those versed in the art are indicated.

A further modification of the microprocessor program for this alternative embodiment is to exempt from the tolerance test of the confirmation steps 4.3 and 4.6, described in relation to the flow chart of FIG. 10, the electrode referred variation values derived from the two adjacent electrodes on each side of the electrode associated with the maximum ERVV. In this alternative embodiment the ERVVs correspond to the SSVVs in FIG. 10.

The remaining features of the embodiment of FIG. 1 are likewise applicable to this alternative preferred embodiment.

There are several changes that can be made in the foregoing described preferred embodiments within the scope of the present invention. For example, in the embodiment of FIG. 2, there are eight drive lines DL1-8 and eight sense lines SL1-8 capacitively coupled in the designated manner to the electrodes E1-64. It is apparent that by suitable analog switching, a line could serve as a drive line at one time and as a sence line at another time. In particular, a 2-of-N coding scheme for the electrodes could be used in which there are N combined drive and sense lines and (N(N−1))/2 electrodes with each electrode being capacitively coupled to each of a unique pair of the combined drive and sense lines. This 2-of-N encoding scheme is well known to those versed in the art.

Another change that can be made in the foregoing described preferred embodiments can be appreciated by referring to FIG. 5, wherein each tab complex includes conductive tabs 20 and 21 respectively of a row electrode E1-32 and a column electrode E33-64. This encoding principle clearly could be extended so that the electrodes could be divided into three or more groups and that finger contact with a touch responsive area overlying a tab complex would result in an increase in the variable capacitance to ground of an electrode from each of the three or more groups.

Yet another change that can be made in the foregoing described preferred embodiments can be appreciated by referring to FIG. 4, wherein a cross-sectional view of the touch sensing array is shown. It is apparent that, in areas not supporting the tabs 20 and 21, the thin film substrate 22 need not remain close to the surface of the touch sensing array and could be covered by some of the supporting layer 23. In some applications this might be desired as a device to protect portions of the electrodes other than the tabs 20,21 from being affected by touch. Alternatively the protective layer 25 can be made thick in areas not covering tabs 20 and 21. The resulting raised portions of the protective layer could serve as well as a guide to finger touch position.

A still further change that could be made in the foregoing described preferred embodiments is in the drive signal patterns shown in FIG. 6 which illustrates a technique of achieving a balancing of drive signals by the simultaneous use of the drive signals DS and the inverted drive signal IDS on a pair of drive lines. It is apparent that other means of balancing could be found which avoid placing a drive signal on more than one drive line at a time and thus avoid having a simultaneous increase in the variable capacitance to ground (VCG) of two electrodes go undetected such as the simultaneous increase in the VCG of electrodes E1 and E2 as is apparent upon referring to Table 3.

An alternative scanning and sense signal value processing method is described with reference to FIGS. 17-19. In this method, because of an increased number of drive signal patterns, a distinction can be made between sense signal variations due to the onset of touch and sense signal variations due to the cessation of touch. Based on this distinction, an erroneous assumption within the signal processing program that the system is in the untouched state will not lead to a misinterpretation of a later cessation of touch.

Figure 17:
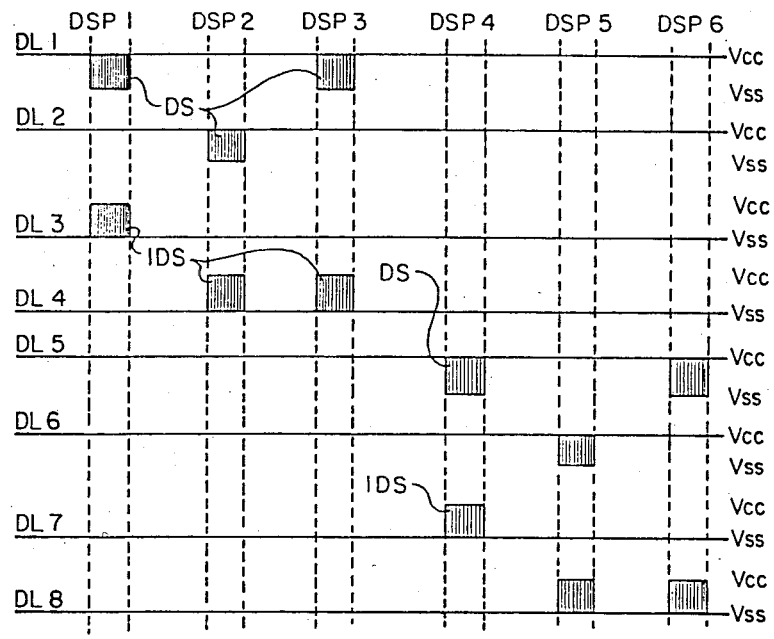
FIG. 17 illustrates the timing and polarity of the different drive signal patterns applied to the drive lines by the drive signal generator in a further preferred embodiment of the system of FIG. 1.

According to this technique the drive signals are provided on the drive lines DL1-8 by the drive signal generator 17 (FIG. 1) in a repetitive sequence of six different drive signal patterns DSP1 through DSP6, as shown in FIG. 17. During DSP1, a drive signal DS is provided on drive line DL1 and an inverted drive signal IDS is provided on drive line DL3. Table 4 shows the association of the drive signal DS, the inverted drive signal IDS, and the drive lines DL during the six different drive signal patterns DSP1-6.

TABLE 4

| | DSP1 | DSP2 | DSP3 | DSP4 | DSP5 | DSP6 |
|---|---|---|---|---|---|---|
| LINE RECEIVING DS | DL1 | DL2 | DL1 | DL5 | DL6 | DL5 |
| LINE RECEIVING IDS | DL3 | DL4 | DL4 | DL7 | DL8 | DL8 |

Location of DS and IDS on DL1-8 during DSP1-6

Referring again to FIG. 17, it is seen that during each drive signal pattern, the paired drive signal DS and inverted drive signal IDS occur simultaneously, are synchronous with each other, of approximately the same value and of opposing polarities. During each cycle of drive signal patterns DSP1-6, a plurality of the drive signal packets, DS, IDS are applied sequentially on some of the drive lines and are paired synchronously with the drive signal packets of opposite polarity IDS, DS on different ones of the other drive lines. For example, drive signal packets DS are applied on drive line DL1 during drive signal patterns DSP1 and DSP3 and are paired synchronously with inverted drive signals on drive lines DL3 and DL4 during drive signal patterns DSP1 and DSP3 respectively.

A complee scan of the keyboard of this embodiment corresponds to a sequence in which the drive signal pattern cycle DSP1-6 is repeated for each of the sense lines SL1-8 to yield a total of 48 sense signal values SSV1-48. Table 5 shows the sign under the polarity choice of DS and IDS of Table 3 of the variation of the respective sense signal values associated with the different electrodes E that is due to the onset of an operator touching a touch responsive area overlying parts of the respective electrodes. The SSV number is a processing sequence identification number and not the value of the sense signal.

TABLE 5

| ROW | | | | | | COLUMN | | | | | |
|---|---|---|---|---|---|---|---|---|---|---|---|
| E | SSV | SIGN | E | SSV | SIGN | E | SSV | SIGN | E | SSV | SIGN |
| 1 | 1,17 | + | 17 | 5,21 | + | 33 | 25,41 | + | 49 | 29,45 | + |
| 2 | 9 | + | 18 | 13 | + | 34 | 33 | + | 50 | 37 | + |
| 3 | 1 | − | 19 | 5 | − | 35 | 25 | − | 51 | 29 | − |
| 4 | 9,17 | − | 20 | 13,21 | − | 36 | 33,41 | − | 52 | 37,45 | − |
| 5 | 2,18 | + | 21 | 6,22 | + | 37 | 26,42 | + | 53 | 30,46 | + |
| 6 | 10 | + | 22 | 14 | + | 38 | 34 | + | 54 | 38 | + |
| 7 | 2 | − | 23 | 6 | − | 39 | 26 | − | 55 | 30 | − |
| 8 | 10,18 | − | 24 | 14,22 | − | 40 | 34,42 | − | 56 | 38,46 | − |
| 9 | 3,19 | + | 25 | 7,23 | + | 41 | 27,43 | + | 57 | 31,47 | + |
| 10 | 11 | + | 26 | 15 | + | 42 | 35 | + | 58 | 39 | + |
| 11 | 3 | − | 27 | 7 | − | 43 | 27 | − | 59 | 31 | − |
| 12 | 11,19 | − | 28 | 15,23 | − | 44 | 35,43 | − | 60 | 39,47 | − |
| 13 | 4,20 | + | 29 | 8,24 | + | 45 | 28,44 | + | 61 | 32,48 | + |
| 14 | 12 | + | 30 | 16 | + | 46 | 36 | + | 62 | 40 | + |
| 15 | 4 | − | 31 | 8 | − | 47 | 28 | − | 63 | 32 | − |
| 16 | 12,20 | − | 32 | 16,24 | − | 48 | 36,44 | − | 64 | 40,48 | − |

For example, at the onset of the touch responsive area overlying a tab complex with a tab from row electrode E1 and a tab from column electrode E48 being touched by an operator there is a positive change in both sense signal values SSV1 and SSV17 and there is a negative change in both sense signal values SSV36 and SSV44.

It will be appreciated upon inspection of Table 5 that the change in sense signal values SSV1-48 brought about by the cessation of operator touch of a single touch responsive area is distinct from the change brought about by the onset of operator touch. For example, the cessation of operator touch of a touch responsive area overlying a tab complex associated with electrode E5 produces opposite changes to those shown in Table 5. Thus there are significant negative changes produced in sense signal values SSV2 and SSV18. These negative changes are seen to uniquely indicate a cessation of operator touch of a touch responsive area overlying a tab complex associated with electrode E5. These changes are not those that occur with the onset of touch of a touch responsive area overlying a touch element associated with electrode E8 because the required negative change in sense signal value SSV10 is not present. Also these changes are not those that occur with the onset of touch of a touch responsive area overlying a tab complex associated with electrode E7 since in that case a significant negative change in sense signal value SSV18 is not present.

The microprocessor 15 is programmed to process the sense signal values SSV1-48 on line 43 iteratively to ascertain the signs and values of the variations SSVV1-48 in SSV1-48 and to process SSVV1-48 as a group to determine whether such variations resulted from a touch responsive area being touched by an operator. The flow charts for this program are shown in FIGS. 7, 18 and 19.

The steps described above in relation to FIG. 7 for the first-described embodiment are also applicable to this program except that in step 2 a scan of the touch sensing array 10 is carried out iteratively with the production of sense signal values SSV1-48 as the program input. Significant program differences are shown in the flow charts of FIGS. 18 and 19. The step-numbering system in FIGS. 18 and 19 agrees in the first digit with that of FIG. 7.

Figure 18:
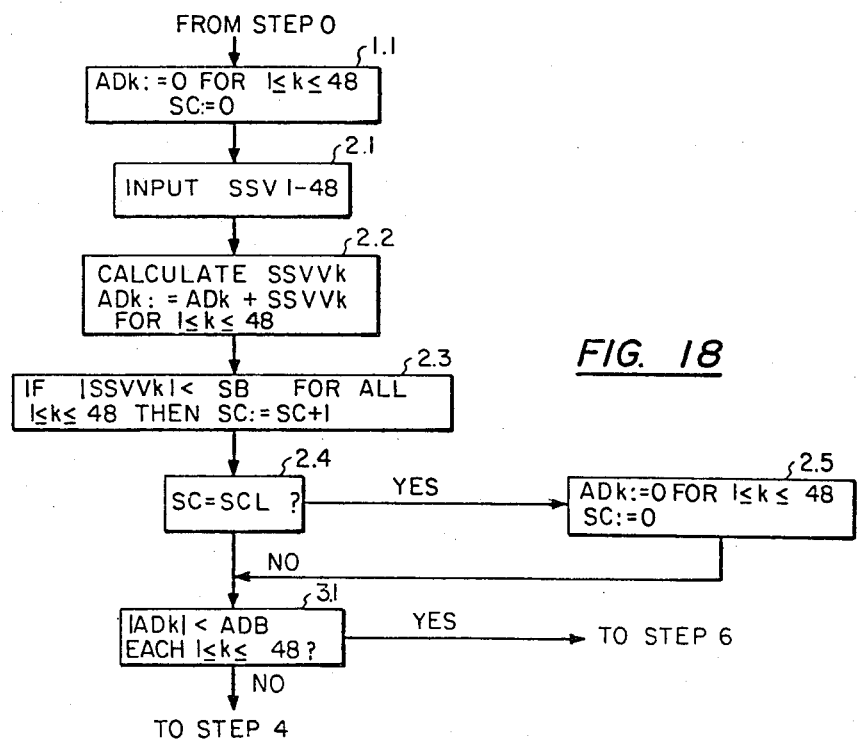

In the flow chart of FIG. 18, step 1.1 consists of initializing accumulated difference values AD1-48 to zero and a stability count SC to zero. Sense signal values SSV1-48 are input in step 2.1. Next, in step 2.2 the sense signal variation value SSVVk is calculated and is added to ADk, the previous sense signal value SSVk is then discarded, and the current SSVk is saved for each k between 1 and 48. In step 2.3 SC is incremented if the magnitude of each of SSVV1-48 is found to be less than a predetermined stability bound SB. Next, in step 2.4 SC is compared to a predetermined stability count limit SCL. If there is equality, there is a branch to step 2.5 where AD1-48 and SC are reset to zero. Otherwise there is a branch to step 3.1.

In step 3.1, if the magnitude of each AD1-48 is found to be smaller than a predetermined accumulated difference bound ADB, the touch sensing array is judged to be in the UNTOUCHED state and there is a branch to step 6, otherwise there is a branch to step 4.

To summarize the function of the program shown in the flow chart of FIG. 18, during each iteration the current sense signal values SSV1-48 are compared with the respective sense signal values obtained during the previous iteration to determine sense signal variation values SSVV1-48. The SSVV1-48 are added to the respective accumulated difference values AD1-48; and each of AD1-48 is compared to a predetermined accumulated difference bound ADB to determine whether the UNTOUCHED state is present. The AD1-48 are reset to an initial value of zero when each of SSVV1-48 remains less than a predetermined stability bound SB over a predetermined number of iterations. Each of SSV1-48 is compared to SB; and the stability count SC is incremented in response to each set of SSV1-48 for which one of SSVV1-48 exceeds the predetermined stability bound SB. AD1-48 and SC are reset to an initial value of zero when SC reaches SCL.

Referring next to FIG. 19, in the course of processing the accumulated differences AD1-48 the microprocessor 15 carries out a feature extraction stage in which it determines ROWMAX1, the maximum magnitude of the accumulated differences AD1-24 which are the differences derived from the row electrodes E1-32 and ROWMAX2, the second largest magnitude of AD1-24. Next, parameters for a confirmation stage are determined; these are TOL1, a tolerance value which is a predetermined fraction of ROWMAX1 and THR2, a predetermined fraction of ROWMAX1 which serves as a threshold value for ROWMAX2. In a similar fashion, the microprocessor 15 determines features COLMAX1, the maximum magnitude of the accumulated differences AD25-48 which are the differences derived from the column electrodes E33-64 and COLMAX2, the second largest magnitude of AD25-48 and determines confirmation parameters TOL2, a tolerance value which is a predetermined fraction of COLMAX1 and THR4, a predetermined fraction of COLMAX1 which serves as a threshold value for COLMAX2. A valid touch onset is judged to be present when separate determinations relating to row electrodes E1-32 and to column electrodes E33-64 are affirmative.

Confirmation requirements for the row component of a valid touch are that (a) ROWMAX1 must exceed a predetermined threshold value THR1; (b) if ROWMAX1 is derived from a row electrode to which two drive signal packets are applied during each repetitive sequence of drive signal patterns DSP1-6, then ROWMAX2 must be derived from the same row electrode as ROWMAX1 and must exceed the threshold THR2; (c) all magnitudes of AD1-24 other than ROWMAX1, and when applicable ROWMAX2, must be less than TOL1; and (d) the specific one of AD1-24 giving rise to ROWMAX1, and when applicable the specific one of AD1-24 giving rise to ROWMAX2, must indicate, on consulting Table 5 (which is stored in the memory of the microprocessor 15), an appropriate response as concerns row electrodes to the onset of touch of a single touch responsive area.

Confirmation requirements for the column component of a valid touch are that (e) COLMAX1 must exceed a predetermined threshold value THR3; (f) if COLMAX1 is derived from a column electrode to which two drive signal packets are applied during each repetitive sequence of drive signal patterns DSP1-6, then COLMAX2 must be derived from the same column electrode as COLMAX1 and must exceed the threshold THR4; (g) all magnitudes of AD25-48 other than COLMAX1, and when applicable COLMAX2, must be less than TOL2; and (h) the specific one of AD25-48 giving rise to COLMAX1, and when applicable the specific one of AD25-48 giving rise to COLMAX2, must indicate, on consulting Table 5, an appropriate response as concerns column electrodes to the onset of touch of a single touch responsive area.

All of such of the eight immediately preceding recited determinations (a)-(h) that are applicable being affirmative indicates the onset of only a single one of the touch responsive areas being touched instantaneously by an operator.

Tests for a valid touch response are carried out in steps 4.1 through 4.14, as shown in the flow chart of FIG. 19. In step 4.1 ROMAX1 is compared to the first predetermined threshold value THR1. If ROWMAX1 exceeds THR1 there is a branch to step 4.2 where the tolerance value TOL1 is set to some fixed fraction of the value of ROWMAX1. Next, in step 4.3 if it is determined that ROWMAX1 is derived from a row electrode to which two drive signal packets are applied during each repetitive sequence of drive signal patterns DSP1-6, whereby a valid touch response requires that the second largest magnitude of AD1-24, ROWMAX2, be over the threshold value THR2, there is a branch to step 4.5. Otherwise there is a branch to step 4.4 where each of AD1-24 other than the one chosen as ROWMAX1 is compared to the tolerance value TOL1. If none of these values exceeds TOL1 then the program branches to step 4.7. In step 4.5 ROWMAX2 is compared to the threshold value THR2. If ROWMAX2 is found to be greater than THR2 there is a branch to step 4.6 where each of AD1-24 other than the ones chosen as ROWMAX1 and ROWMAX2 is compared to TOL1. If none of these values exceeds TOL1 there is a branch to step 4.7 where the accumulated difference associated with ROWMAX1 and when applicable the accumulated difference associated with ROWMAX2 are checked using the information in Table 5. If the result is found to be valid, then a VALID ROW TOUCH is judged to be present and the program branches to step 4.8.

In step 4.8, the variable COLMAX1 is compared to the threshold value THR3. If COLMAX1 exceeds THR3 then TOL2 is calculated as a fixed fraction of COLMAX1 in step 4.9. In step 4.10, if it is determined that COLMAX1 is derived from a column electrode to which two drive signal packets are applied during each repetitive sequence of drive signal patterns DSP1-6, whereby a valid touch response requires that the second largest of AD25-48, COLMAX2, be over the threshold value THR2, there is a branch to step 4.12. Otherwise there is a branch to step 4.11 where each of AD25-48 other than the one closed as COLMAX1 is compared to the tolerance value TOL2. If none of these values exceeds TOL2, then the program branches to step 4.14. In step 4.12, COLMAX2 is compared to the threshold value THR4. If COLMAX2 is found to be greater than THR4, there is a branch to step 4.13 where each of AD25-48 other than the ones chosen as COLMAX1 and COLMAX2 is compared to TOL2. If none of these values exceeds TOL2, there is a branch to step 4.14 where the accumulated difference associated with COLMAX1 and when applicable the accumulated difference associated with COLMAX2 are checked using the information in Table 5. If the result is found to be valid, then the tests for a VALID TOUCH have been passed and there is an exit to step 5.1.

Failing any of the tests of steps 4.1, 4.4, 4.5, 4.6, 4.7, 4.8, 4.11, 4.12, 4.13, or 4.14 causes a branch to step 7 where an INVALID RESPONSE is processed. In step 5.1 processing of a VALID TOUCH response is carried out including the appropriate encoding of the touched touch responsive area by row number and by column number which numbers may be calculated using the information in Table 5.

As an example of program parameter choices, suppose that accumulated difference values of over sixteen units are reliably produced by operator touch under typical operating conditions. THR1 and THR3 may be set equal to eight. SCL may be chosen so that the accumulated differences AD1-48 are reset to zero after 0.5 seconds of stable operation. In step 4.2 TOL1 may be assigned the value of ROWMAX1/4 and in step 4.9 TOL2 may be assigned the value of COLMAX1/4. In step 4.5 THR2 may be assigned the value of ROWMAX1/2 and in step 4.12 THR4 may be assigned the value of COLMAX1/2. It is thus a feature of this program that AD1-48 may be reset to zero when operator touch of a touch responsive area is present for an extended dwell time without danger of misinterpretation of the subsequent AD1-48 that occur when operator touch is removed from the tab complex. This is in contrast to the situation described above in conjunction with the first-described preferred embodiment discussed in relation to FIGS. 6-12, where resetting baseline values during touch is prohibited since misinterpretation of the cessation of touch would then occur.

Alternatives to the method of resetting of the accumulated differences AD1-48 as described above will be obvious to one skilled in the art. For example, resetting could be delayed when valid touch is judged to be present to allow for an extended dwell period and resetting could be hastened in the period immediately following a response indicative of the cessation of touch. As a further example, each ADk could be replaced periodically with a fixed fraction of its value for each k between 1 and 48 and the rate of replacement could depend on such factors as stability and the state of the system with respect to touch.

Except for the differences discussed above in the description of the preferred embodiment of FIGS. 17-19, this preferred embodiment (FIGS. 17-19) is constructed and functions in the same manner as the preferred embodiment first described above in relation to FIGS. 1-12. It will be apparent to one skilled in the art that the optional capacitor trimming step of manufacture discussed in conjunction with Table 3 must be modified if drive signal patterns DSP1-6 of Table 4 are employed, since electrodes associated with two sense signal values will necessarily be involved in two trimming and balancing operations. It will be apparent to one skilled in the art that the needed algebraic independence of trimming effects is present for simultaneously achieving balance for all of SSV1-48.

An alternative method of attaining the desired balance of DS and IDS on each of the sense lines SL1-8 during each of DSP1-4 which replaces the trimming procedure described in conjunction with Table 3 involves modifications of the features described above with reference to FIGS. 1, 7, 8, and 9. In this alternative method, the microprocessor 15 and the drive signal generator 17 of FIG. 1 are configured so that the amplitude of one or both of the drive signals DS and IDS of FIG. 6 are under program control. Preferably, the amplitude of DS is under program control and the amplitude of IDS is fixed. The range of possible amplitudes of DS that can be obtained under program control is such that, in the absence of operator touch, balancing of DS and IDS on each of the sense lines SL1-8 during each of the drive signal periods DSP1-4 can be achieved through the control of the amplitude of DS. During the initializing step, step 1 of FIG. 7, the microprocessor creates and stores a table of drive signal control parameters DSCP1-32. For each k between 1 and 32, the parameter DSCPk controls the amplitude of DS during the generation of the sense signal value SSVk of Table 3. Methods of controlling the amplitude of a drive signal packet such as DS based on the value of a stored parameter are well known to those skilled in the art. The drive signal control parameter DSCPk is chosen during initialization so that the sense signal value SSVk is as near as possible to the mid-range value of 128. Procedures for optimaly selecting the value of a control parameter such as DSCPk are well known to those skilled in the art. Step 1.1 of FIG. 8 is modified so that the value of the drive signal control parameter resulting in the value of SSVk nearest 128 is stored as DSCPk and this value of SSVk nearest 128 is stored as BVk and as RVk. Step 2.1 of FIG. 9 is modified to include an updating procedure for the drive signal control parameters DSCP1-32. This updating procedure, which is carried out for each k between 1 and 32 when the baseline drift compensation count lies in a predetermined range and when the stored value of SSVk differs from the mid-range value 128 by more than a predetermined tolerance value, is described in Table 6.

TABLE 6

| Step | Procedure |
| --- | --- |
| A. | Store SSVk as OLD__SSV |
| B. | Store DSCPk as OLD__DSCP |
| C. | Choose the optimal value NEW__DSCP for DSCPk which results in a value of SSVk as near as possible to the mid-range value of 128 |
| D. | Store the value of SSVk nearest to 128 obtained in step C as NEW__SSV |
| E. | Test the stability of the system: 1. use OLD__DSCP as DSCPk and obtain a further SSVk 2. compare this further SSVk to OLD__SSV |
| F. | If the system is found to be sufficiently stable in Step E then replace DSCPk with NEW__DSCP and replace BVk and RVk with NEW__SSV, otherwise DSCPk, BVk, and RVk are not revised |

An addition to Step C in Table 6 may be that the value NEW__DSCP be constrained to differ by no more than a set amount from OLD__DSCP, thereby simplifying the search for the optimal value of NEW__DSCP.

In an alternative mode of operation of the system of FIG. 1, the operation of the synchronous demodulator 13 is modified. In this alternate mode, the phase of operation of the synchronous demodulator 13 is controlled by the microprocessor 15 using stored phase control parameters. Phase effects in synchronous demodulation are well known to those skilled in the art. Control of the phase of demodulation may be complicated by phase changes in the drive signals which accumulate as the drive signals propagate through the conductor arrays and the band pass amplifier 12 of FIG. 1. The phase of demodulation can be fixed throughout all processing periods of the touch sensing array system or alternatively the phase can be independently regulated during the period that each sense signal value SSVk is obtained for each k between 1 and 32. Phase control parameters may be stored in the read only memory (ROM) of the microprocessor 15 or alternatively the phase control parameters may be determined during initialization of the touch sensing array system in step 1 of FIG. 6 and stored in the random access memory (RAM) of the microprocessor 15. In the presence of conditions of operation of the touch sensing array system that alter the phase of the drive signals at the synchronous demodulator, dynamic updating of phase control parameters may be employed.

I claim:

1. A capacitance-variation-sensitive touch sensing array system comprising
   an array of electrodes with each electrode including a connected series of conductive tabs;
   an array of keys with each key overlying at least one tab of at least one of said electrodes for varying the capacitance between said electrode and ground upon the key being touched by an operator;
   an array of drive lines capacitively coupled to the electrodes, with individual drive lines being coupled to a plurality of the electrodes;
   drive means for applying drive signals to the drive lines to drive the electrodes coupled thereto;
   an array of sense lines capacitively coupled to the electrodes, to derive sense signals from the electrodes when drive signals are applied to the drive lines, with each of said sense lines being so coupled to a plurality of the electrodes as to be interconnected via unique combinations of electrodes to said drive lines such that the sense lines derive unique combined patterns of variations in said sense signals in response to actuation of each of the keys;
   means coupled to the sense lines for sensing said patterns of variations in said sense signals; and
   means coupled to the sensing means for processing the sense signals to provide information associated with any particular key that is touched by an operator;
   whereby the number of keys exceeds the product of the number of drive lines and the number of sense lines.

2. A system according to claim 1,
   wherein the electrodes are arrayed in rows and columns; and
   wherein each key overlies a tab complex made up of a tab of one of the row electrodes and a tab of one of the column electrodes.

3. A system according to claim 1,
   wherein each electrode is capacitively coupled to only one drive line and to only one sense line; and
   wherein no given drive line and sense line pair is connected to more than one electrode in common.

4. A system according to claim 1,
   wherein the drive means generate drive signals comprising alternating signal packets, with simultaneously occurring signal packets being generated synchronously on different drive lines; and
   wherein the means for sensing the sense signals on the sense lines includes means for synchronously demodulating the sensed signals to cause the demodulation of the sensed signals to be synchronous with the generation of the corresponding drive signal packets by the drive means.

5. A system according to claim 4, wherein the processing means uses stored phase control parameters to control the phase of demodulation of the sensed signals by the demodulating means.

6. A system according to claim 3, wherein the different drive signals in combination include alternating signal packets applied at the same time to pairs of drive lines with the simultaneously occurring signal packets being synchronous with each other, of approximately the same amplitude, and of opposing polarities to thereby cause the amplitude of the sense signal appearing on a sense line connected to separate electrodes driven by each of the simultaneously occurring drive signals to be low in relation to the variation in the amplitude of said sense signal resulting from a key being touched by an operator.

7. A system according to claim 6, wherein the capacitors coupling the drive lines to the electrodes and the capacitors coupling the electrodes to the sense lines are trimmed in order to balance each pair of the transmitted drive signals of opposing polarities appearing on a sense line.

8. A system according to claim 6, wherein the processing means controls the amplitudes of one or both of the individual drive signals of each pair of the simultaneously occuring drive signals of opposing polarities in order to balance the transmitted drive signals appearing on a sense line.

9. A system according to claim 6,
   wherein the drive means comprise a drive signal generator for applying sequentially during each repetitive sequence a plurality of said signal packets on some of the drive lines paired synchronously with said signal packets of opposite polarity on different ones of the other drive lines; and
   wherein the processing means include means for determining whether a sensed variation in the capacitance between an electrode and circuit ground is due to the onset or the cessation of touching a key by an operator.

10. A system according to claim 1, further comprising first, second, and third dielectric substrates;
    wherein a first portion of the electrode array is supported by one side of the first dielectric substrate and a second portion of the electrode array is supported by the opposite side of the first dielectric substrate;
    wherein an individual key of the array of keys overlies a first tab supported by the one side of the first dielectric substrate and extending from an electrode of the first portion of the array and a second tab supported by the opposite side of the first dielectric substrate and extending from an electrode of the second portion of the array adjacent to the position underlying the first tab so that the capacitance between both electrodes and ground is varied when the key is touched by an operator;
    wherein the drive lines and sense lines are supported by opposite sides of the second dielectric substrate;
    wherein the third dielectric substrate separates the second dielectric substrate supporting the drive lines and the sense lines from the first dielectric substrate supporting the electrode arrays; and
    wherein the drive lines and sense lines on the second dielectric substrate are dimensioned and disposed in spatial relation to the electrodes on the first dielectric substrate so that the required capacitive coupling of drive lines to electrodes and of sense lines to electrodes is obtained.

11. A system according to claim 1, further comprising a thin dielectric substrate;
    wherein a first portion of the electrode array is supported by one side of the dielectric substrate and a second portion of the electrode array is supported by the opposite side of the dielectric substrate;

wherein an individual key of the array of keys overlies a first tab supported by the one side of the dielectric substrate and extending from an electrode of the first portion of the array and a second tab supported by the opposite side of the dielectric substrate and extending from an electrode of the second portion of the array adjacent to the position underlying the first tab so that the capacitance between both electrodes and ground is varied when the key is touched by an operator;

wherein the drive lines and sense lines are supported by the dielectric substrate; and wherein a drive line or sense line on one side of the substrate is coupled to an electrode on the opposite side of the substrate by a capacitor comprising a first plate supported by the one side of the substrate and extending from the coupled drive line or sense line; and a second oppositely disposed plate supported by the opposite side of the substrate and extending from the coupled electrode.

12. A system according to claim 1, wherein the processing means comprise means for providing sense signal values in accordance with the amplitudes of the respective sense signals;

means for processing the sense signal values iteratively to ascertain the values of variations in the sense signal values; and means for processing the sense signal variation values to determine that an operator touch is present at a specific location when the sense signal variation values match a pattern of variation values characteristically associated with touch at that specific location.

13. A system according to claim 12, wherein the means for processing the variation values process the variation values as one or more groups in two stages, the first stage being a feature extraction stage in which a search is made for features indicative of touch and the second stage being a confirmation stage which is carried out when an affirmative determination is made in the first stage and in which tests are carried out to confirm that a pattern of sense signal value variation characteristic of a key being touched by an operator is or is not present.

14. A system according to claim 13, wherein the electrode array defines rows and columns of electrodes; and wherein the means for processing the variation values comprises means for determining in the feature extraction stage whether the maximum of the group of variation values derived from the row electrodes exceeds a predetermined threshold value;

means for determining in the confirmation stage whether no other of the group of variation values derived from the row electrodes exceeds a tolerance value that may depend on said maximum variation value derived from the row electrodes;

means for determining in the feature extraction stage whether the maximum of the group of variation values derived from the column electrodes exceeds a predetermined threshold value;

means for determining in the confirmation stage whether no other of the group of variation values derived from the column electrodes exceeds a tolerance value that may depend on said maximum variation value derived from the column electrodes; and means for determining in response to all of said four immediately preceding recited determinations being affirmative that the maximum variation value derived from the row electrodes and the maximum variation value derived from the column electrodes each resulted from only a single one of the keys being touched instantaneously by an operator.

15. A system according to claim 1, wherein the processing means comprise means for providing sense signal values in accordance with the amplitudes of the respective sense signals; and means for processing the sense signal values iteratively by comparing the sense signal values with baseline values derived from sense signal values provided when the touch sensing array is untouched by an operator to determine which one of three states is present, the first state being an untouched state, the second state being a valid touch state in which a valid touch by an operator is present, and the third state being an invalid response state which occurs when neither said first state nor said second state is present.

16. A system according to claim 15, wherein the processing means revises the baseline values in response to sensed variations in the sense signal values which are stable over a predetermined number of iterations and which indicate the invalid response state of the touch sensing array.

17. A system according to claim 16, wherein the means for revising the baseline values comprises means for storing a set of reserve values derived from a set including each of the respective sense signal values;

means for iteratively comparing each sense signal value to each corresponding reserve value;

means for revising the stored set of reserve values to correspond to a current set of sense signal values whenever the difference between any sense signal value and the corresponding reserve value exceeds a predetermined bound value; and means for revising the baseline values to correspond to the reserve values when the invalid response state is present for a predetermined number of iterations during which time not revision of the reserve values occurs, no revision of baseline values to correspond to reserve values occurs and the valid touch state is not present.

18. A system according to claim 15, wherein the processing means comprise means for compensating for drift in the sense signal values that are provided when the keys are in the untouched state, wherein the baseline values are updated by either incrementing or decrementing each of the respective baseline values in accordance with whether the baseline value is less or greater than the respective last-provided sense signal value when the untouched state is present for a predetermined number of consecutive iterations during which time no updating of the baseline values occurs.

19. A system according to claim 18, wherein the compensating means further comprises means for delaying by degree the updating of baseline values when the invalid response state occurs only intermittently.

20. A system according to claim 1, wherein the processing means comprise
means for providing sense signal values in accordance with the amplitude of the respective sense signals;
means for processing the sense signal values iteratively to determine whether any of the keys has been touched by an operator by comparing the current sense signal values during each iteration with the respective sense signal values during the previous iteration, by adding the same signal variation value derived from said comparison to an accumulated difference value for each sense signal, and by determining whether a key has been touched by processing the accumulated difference values; and
means for resetting the accumulated difference values to an initial value when the sense signal variation values remain less than a predetermined bound value over a predetermined number of consecutive iterations during which no resetting of the accumulated difference values to the initial value occurs.

21. A capacitance-variation-sensitive touch sensing array system comprising
an array of electrodes with each electrode including a connected series of conductive tabs;
a touch responsive panel overlying and coextensive with the electrode array for varying the capacitance between a plurality of the electrodes and ground simultaneously upon the interior area of the touch responsive panel being touched by an operator;
an array of drive lines capacitively coupled to the electrodes, with individual drive lines being coupled to a plurality of the electrodes;
drive means for applying drive signals to the drive lines to drive the electrodes coupled thereto;
an array of sense lines capacitively coupled to the electrodes to derive sense signals from the electrodes when drive signals are applied to the drive lines, with each of said sense lines being so coupled to a plurality of the electrodes as to be interconnected via unique combinations of electrodes to said drive lines such that the sense lines derive unique combined patterns of variations in said sense signals in response to touching distinct locations on the panel;
means coupled to the sense lines for sensing said patterns of variations in said sense signals; and
means coupled to the sensing means for processing the sense signals to provide an estimate of the location of operator touch;
whereby the number of said distinct locations of operator touch that can be estimated exceeds twice the product of the number of drive lines and the number of sense lines.

22. A system according to claim 21,
wherein each electrode is capacitively coupled to only one drive line and to only one sense line; and
wherein no given drive line and sense line pair is connected to more than one electrode in common.

23. A system according to claim 21,
wherein the drive means generate drive signals comprising alternating signal packets, with simultaneously occurring signal packets being generated synchronously on different drive lines; and
wherein the means for sensing the sense signal on the sense lines includes means for synchronously demodulating the sensed signals to cause the demodulation of the sensed signals to be synchronous with the generation of the corresponding drive signal packets by the drive means.

24. A system according to claim 23, wherein the processing means uses stored phase control parameters to control the phase of demodulating of the sensed signals by the demodulating means.

25. A system according to claim 22, wherein the different drive signals in combination include alternating signal packets applied at the same time to pairs of drive lines with the simultaneously occuring signal packets being synchronous with each other, of approximately the same amplitude, and of opposing polarities to thereby cause the amplitude of the sense signal appearing on a sense line connected to separate electrodes driven by each of the simultaneously occurring drive signals to be low in relation to the variation in the amplitude of said sense signal resulting from the touch responsive area being touched by an operator.

26. A system according to claim 25, wherein the capacitors coupling the drive lines to the electrodes and the capacitors coupling the electrodes to the sense lines are trimmed in order to balance each pair of the transmitted drive signals of opposing polarities appearing on a sense line.

27. A system according to claim 25, wherein the processing means controls the amplitudes of one or both of the individual drive signals of each pair of the simultaneously occuring drive signals of opposing polarities in order to balance the transmitted drive signals appearing on a sense line.

28. A system according to claim 21, further comprising
first, second, and third dielectric substrates;
wherein the electrode array defines rows and columns of electrodes;
wherein the row electrodes are supported by one side of the first dielectric substrate and the column electrodes are supported by the opposite side of the first dielectric substrate;
wherein the tabs of the column electrodes on one side of the first substrate are disposed so as to lie between the tabs of the row electrodes on the opposite side of the first substrate;
wherein the drive lines and sense lines are supported by opposite sides of the second dielectric substrate;
wherein the third dielectric substrate separates the second dielectric substrate supporting the drive lines and the sense lines from the first dielectric substrate supporting the electrode arrays; and
wherein the drive lines and sense lines on the second dielectric substrate are dimensioned and disposed in spatial relation to the electrodes on the first dielectric substrate so that the required capacitive coupling of drive lines to electrodes and of sense lines to electrodes is obtained.

29. A system according to claim 21, further comprising
a thin dielectric substrate;
wherein the electrode array defines rows and columns of electrodes;
wherein the row electrodes are supported by one side of the dielectric substrate and the column electrodes are supported by the opposite side of the dielectric substrate;

wherein the tabs of the column electrodes on one side of the substrate are disposed so as to lie between the tabs of the row electrodes on the opposite side of the substrate;

wherein the drive lines and sense lines are supported by the dielectric substrate; and wherein a drive line or sense line on one side of the substrate is coupled to an electrode on the opposite side of the substrate by a capacitor comprising a first plate supported by the one side of the substrate and extending from the coupled drive line or sense line; and a second oppositely disposed plate supported by the opposite side of the substrate and extending from the coupled electrode.

30. A system according to claim 21, wherein the processing means comprise means for providing sense signal values in accordance with the amplitudes of the respective sense signals;

means for processing the sense signal values iteratively to ascertain the values of variations in the sense signal values; and means for processing the sense signal variation values to determine that an operator touch is present at a specific location when the sense signal variation values match a pattern of variation values characteristically associated with touch at that specific location.

31. A system according to claim 30, wherein the means for processing the variation values process the variation values as one or more groups in three stages, the first stage being a feature extraction stage in which a search is made for features indicative of touch, the second stage being a confirmation stage which is carried out when an affirmative determination is made in the first stage and in which tests are carried out to confirm that a pattern of sense signal value variation characteristic of touch by an operator is or is not present, and the third stage being an interpolation stage which is carried out when affirmative determinations are made in the first and second stages and in which an interpolation procedure using the variation values of a group supplies a coordinate position for the location of touch.

32. A system according to claim 31, wherein the electrode array defines rows and columns of electrodes; and wherein the means for processing the variation values comprises means for determining in the feature extraction stage whether the maximum of the group of variation values derived from the row electrodes exceeds a predetermined threshold value;

means for determining in the confirmation stage whether none of the other variation values derived from the row electrodes other than a given number of row electrodes on each side of and adjacent to the row electrode from which said maximum variation value is derived exceeds a tolerance value that is a predetermined fraction of said maximum variation value derived from the row electrodes;

means for estimating in the interpolation stage by an interpolation formula the y coordinate of operator touch from the group of variation values derived from the row electrodes;

means for determining in the feature extraction stage whether the maximum of the group of variation values derived from the column electrodes exceeds a predetermined threshold value;

means for determining in the confirmation stage whether none of the other variation values derived from the column electrodes other than a given number of column electrodes on each side of and adjacent to the column electrode from which said maximum variation value is derived exceeds a tolerance value that is a predetermined fraction of said maximum variation value derived from the column electrodes; and means for estimating in the interpolation stage by an interpolation formula the x coordinate of operator touch from the group of variation values derived from the column electrodes.

33. A system according to claim 21, wherein the processing means comprises means for providing sense signal values in accordance with the amplitudes of the respective sense signals; and means for processing the sense signal values iteratively by comparing the sense signal values with baseline values derived from sense signal values provided when the touch sensing array is untouched by an operator to determine which one of three states is present, the first state being an untouched state, the second state being a valid touch state in which a valid touch by an operator is present, and the third state being an invalid response state which occurs when neither said first state nor said second state is present.

34. A system according to claim 33, wherein the processing means revises the baseline values in response to sensed variations in the sense signal values which are stable over a predetermined number of iterations and which indicate the invalid response state of the touch sensing array.

35. A system according to claim 34, wherein the means for revising the baseline values comprises means for storing a set of reserve values derived from a set including each of the respective sense signal values;

means for iteratively comparing each sense signal value to each corresponding reserve value;

means for revising the stored set of reserve values to correspond to a current set of sense signal values whenever the difference between any sense signal value and the corresponding reserve value exceeds a predetermined bound value; and means for revising the baseline values to correspond to the reserve values when the invalid response state is present for a predetermined number of iterations during which time no revision of the reserve values occurs, no revision of baseline values to correspond to reserve values occurs and the valid touch state is not present.

36. A system according to claim 33, wherein the processing means comprise means for compensating for drift in the sense signal values that are provided when the touch sensing array is in the untouched state, wherein the baseline values are updated by either incrementing or decrementing each of the respective baseline values in accordance with whether the baseline value is less or greater than the respective last-provided sense signal value when the untouched state is present for a predetermined number of consecutive iterations during which time no updating of the baseline values occurs.

37. A system according to claim 36, wherein the compensating means further comprises
means for delaying by degree the updating of baseline values when the invalid response state occurs only intermittently.

38. A capacitance-variation-sensitive touch sensing array system comprising
an array of electrodes with each electrode including at least one conductive tab;
an array of keys with each key overlying at least one tab of at least one electrode of the electrode array for varying the capacitance between each said overlaid electrode and ground upon the key being touched by an operator;
drive means for applying drive signals to drive the electrodes;
an array of sense lines coupled to the electrodes;
sensing means coupled to each of the sense lines to derive a digital sense value from each of the respective sense lines when drive signals are applied to the electrodes, which digital sense value is dependent on variations in the electrode to ground capacitance of at least one of the electrodes, with said sense lines being so coupled to the electrodes as to be interconnected via the electrodes to said drive lines such that said sense lines derive unique combined patterns of variations in said sense signals in response to actuation of each of the keys; and
means for processing the digital sense values iteratively to ascertain the values of variations in the digital sense values and for processing the variation values in two stages, the first stage being a feature extraction stage in which a search is made for said digital sense value variations that may be indicative of a given key being touched and the second stage being a confirmation stage which is carried out when an affirmative determination is made in the first stage and in which said digital sense value variations for which said affirmative determination was made during the feature extraction stage are processed together with a predetermined group of digital sense value variations to determine whether said unique combined pattern of digital sense value variations characteristic of said given key being touched by an operator is or is not present.

39. A system according to claim 38,
wherein the keys of the touch sensing array defines rows and columns of keys;
wherein the digital sense values include two groups with the first group providing information associated with the row of a key and with the second group providing information associated with the column of a key;
wherein the effect of operator touch of a single key of the touch sensing array is to predominantly vary one digital sense value in the first group of digital sense values associated with rows of keys and one digital sense value in the second group of digital sense values associated with columns of keys; and
wherein the means for processing the variations in the digital sense values comprises
means for determining in the feature extraction stage whether the maximum variation in the values associated with rows of keys exceeds a predetermined threshold value;
means for determining in the confirmation stage whether none of the other variations in the digital sense values associated with rows of keys exceeds a tolerance value that may depend on said maximum variation value derived from the rows of keys;
means for determining in the feature extraction stage whether the maximum variation in the values associated with columns of keys exceeds a predetermined threshold value;
means for determining in the confirmation stage whether none of the other variations in the digital sense values associated with columns of keys exceeds a tolerance value that may depend on said maximum variation value derived from the columns of keys; and
means for determining in response to all of said four immediately preceding recited determinations being affirmative that the maximum variation value derived from the rows of keys and the maximum variation value derived from the columns of keys each resulted from only a single key being touched instantaneously by an operator.

40. A system according to claim 38, wherein the processing means comprises
means for processing the digital sense values iteratively by comparing the digital sense values with baseline digital sense values derived from digital sense values provided when the touch sensing array is untouched by an operator to determine which one of three states is present, the first state being an untouched state, the second state being a valid touch state in which a valid touch by an operator is present, and the third state being an invalid response state which occurs when neither said first state nor said second state is present.

41. A system according to claim 40, wherein the processing means revises the baseline digital sense values in response to sensed variations in the digital sense values which are stable over a predetermined number of iterations and which indicate the invalid response state of the touch sensing array.

42. A system according to claim 41, wherein the means for revising the baseline digital sense values comprises
means for storing a set of reserve values derived from a set including each of the respective digital sense values;
means for iteratively comparing each digital sense value to each corresponding reserve value;
means for revising the stored set of reserve values to correspond to a current set of digital sense values whenever the difference between any digital sense value and the corresponding reserve value exceeds a predetermined bound value; and
means for revising the baseline digital sense values to correspond to the reserve values when the invalid response state is present for a predetermined number of iterations during which time no revision of the reserve values occurs, no revision of baseline digital sense values to correspond to reserve values occurs and the valid touch state is not present.

43. A system according to claim 40, wherein the processing means comprises
means for compensating for drift in the baseline digital sense values that are provided when the touch sensing array is in the untouched state wherein the baseline digital sense values are updated by either incrementing or decrementing each of the respective baseline digital sense values in accordance with whether the baseline digital sense value is less or greater than the respective last-provided digital sense value when the untouched state is present for a predetermined number of consecutive iterations during which time no updating of the baseline digital sense values occurs.

44. A system according to claim 43, wherein the compensating means further comprises
means for delaying by degree the updating of baseline digital sense values when the invalid response state occurs only intermittently.

45. A system according to claim 9, wherein the processing means comprise
means for providing sense signal values in accordance with the amplitudes of the respective sense signals; and
means for processing the sense signal values iteratively to ascertain the values of accumulated differences in the sense signal values and for processing the accumulated differences as a group to determine whether any said differences resulted from a key being touched by an operator;
wherein the electrode array defines rows and columns of electrodes; and
wherein the means for processing the accumulated differences comprises
means for determining whether the maximum accumulated difference derived from the row electrodes exceeds a predetermined threshold value;
means for determining whether all other accumulated differences derived from the same row electrode as said maximum accumulated difference derived from the row electrodes exceed a threshold value which may depend on said maximum accumulated difference derived from the row electrodes;
means for determining that no accumulated difference derived from a row electrode other than said same row electrode exceeds a tolerance value which may depend on said maximum accumulated difference derived from the row electrodes;
means for determining whether the maximum accumulated difference derived from the column electrodes exceeds a predetermined threshold value;
means for determining whether all other accumulated differences derived from the same column electrode as said maximum accumulated difference derived from the column electrodes exceed a threshold value which may depend on said maximum accumulated difference derived from the column electrodes;
means for determining that no accumulated difference derived from a column electrode other than said same column electrode exceeds a tolerance value which may depend on said maximum accumulated difference derived from the column electrodes; and
means for determining, in response to such of said six immediately preceding recited determinations that are applicable being affirmative, that the accumulated differences derived from the row electrodes and the accumulated differences derived from the column electrodes resulted from the onset of only a single one of the keys being touched instantaneously by an operator.

* * * * *